US012648239B2

(12) United States Patent
Yang et al.

(10) Patent No.: US 12,648,239 B2
(45) Date of Patent: Jun. 2, 2026

(54) MULTI-LAYER IMAGE SENSOR STRUCTURE WITH DARK CURRENT SENSING PHOTODIODES IN BLACK LEVEL CALIBRATION AREA SURROUNDED BY DUAL SEAL RING SYSTEM AND OPAQUE COVER WITH INTEGRATED TRENCH ISOLATION

(71) Applicant: TAIWAN SEMICONDUCTOR MANUFACTURING COMPANY, LTD., Hsinchu (TW)

(72) Inventors: Ming-Hsien Yang, Taichung City (TW); Chun-Hao Chou, Tainan City (TW); Kuo-Cheng Lee, Tainan City (TW); Chun-Wei Chia, Kaohsiung City (TW); Chun-Liang Lu, Tainan City (TW); Wei-Chih Weng, Tainan City (TW); Cheng-Hao Chiu, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 494 days.

(21) Appl. No.: 18/126,320

(22) Filed: Mar. 24, 2023

(65) Prior Publication Data

US 2024/0006425 A1 Jan. 4, 2024

Related U.S. Application Data

(60) Provisional application No. 63/442,681, filed on Feb. 1, 2023, provisional application No. 63/357,376, filed on Jun. 30, 2022.

(51) Int. Cl.
*H01L 27/146* (2006.01)
*H04N 25/633* (2023.01)
(Continued)

(52) U.S. Cl.
CPC ....... *H10F 39/8023* (2025.01); *H04N 25/633* (2023.01); *H10F 39/8037* (2025.01); *H10F 39/8053* (2025.01); *H10F 39/182* (2025.01)

(58) Field of Classification Search
CPC ............. H10F 39/8023; H10F 39/8037; H10F 39/8053; H10F 39/182; H10F 39/199;
(Continued)

(56) References Cited

U.S. PATENT DOCUMENTS 10,165,211 B1 12/2018 Borthakur et al.
10,269,843 B2 4/2019 Hsu et al.
(Continued)

FOREIGN PATENT DOCUMENTS

CN 208797003 U 4/2019
CN 110034139 A 7/2019
(Continued)

*Primary Examiner* — Ermias T Woldegeorgis
(74) *Attorney, Agent, or Firm* — STUDEBAKER BRACKETT PLLC

(57) ABSTRACT

An image sensor includes a substrate having first and second surfaces opposite to each other, an image pixel area, and a black level calibration (BLC) area adjacent to the image pixel area. The BLC area includes a dark current sensing circuit including photo diodes disposed in the substrate, a first seal ring disposed over the second surface and surrounding the image pixel area in plan view, a second seal ring disposed over the second surface and surrounding the image pixel area in plan view such that the dark current sensing circuit is disposed between the first and second seal rings, an opaque cover disposed over the first surface and covering the dark current sensing circuit, the first and second seal rings, and one or more first trench isolation structures extending from the first surface to an inside the substrate and disposed between the first seal ring and the opaque cover.

20 Claims, 21 Drawing Sheets

(51) Int. Cl.
    *H10F 39/00*          (2025.01)
    *H10F 39/18*          (2025.01)

(58) Field of Classification Search
    CPC .. H10F 39/807; H10F 39/8057; H10F 39/811;
                                     H04N 25/633
    See application file for complete search history.

(56)                  References Cited

U.S. PATENT DOCUMENTS

| | | | |
|---|---|---|---|
| 10,804,304 B2 | 10/2020 | Noh et al. | |
| 10,991,742 B2 | 4/2021 | Han et al. | |
| 11,133,343 B2 | 9/2021 | Yamagishi et al. | |
| 2013/0258144 A1* | 10/2013 | Chen ..................... | H10F 39/199 |
| | | | 348/E5.079 |

FOREIGN PATENT DOCUMENTS

| | | |
|---|---|---|
| CN | 110875341 A | 3/2020 |
| TW | 201735334 A | 10/2017 |
| TW | 201901938 A | 1/2019 |

* cited by examiner

MULTI-LAYER IMAGE SENSOR STRUCTURE WITH DARK CURRENT SENSING PHOTODIODES IN BLACK LEVEL CALIBRATION AREA SURROUNDED BY DUAL SEAL RING SYSTEM AND OPAQUE COVER WITH INTEGRATED TRENCH ISOLATION

RELATED APPLICATIONS

This application claims priority to U.S. Provisional Patent Application Nos. 63/357,376 filed Jun. 30, 2022 and 63/442,681 filed Feb. 1, 2023, the entire contents of each of which are incorporated herein by reference.

BACKGROUND

As the semiconductor industry has progressed into nanometer technology process nodes in pursuit of higher device density, greater performance, and lower costs, challenges for both design and fabrication of integrated circuits have greatly increased. Nowadays, CMOS image sensors are integrated with other CMOS circuits, such as a large scale integrated circuit (LSI), a system-on-chip (SOC), an application specific integrated circuit (ASIC), or other semiconductor circuits. Techniques for improving performances of the CMOS image sensors have been continuously desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

With technical developments in integrated circuit (IC) and semiconductor industries, sizes or pitches of pixel image sensors of the CMOS image sensors (CIS s) are greatly reduced to increase image resolution and reduce costs. Some CMOS image sensors include a dark voltage (or current) calibration (or reference) circuit (black level calibration (BLC)) to provide a reference signal as a dark voltage current (DVC). The present disclosure generally relates to a CMOS image sensor including a BLC circuit, which can provide a more reliable and correct DVC for the black level calibration.

Figure 1:
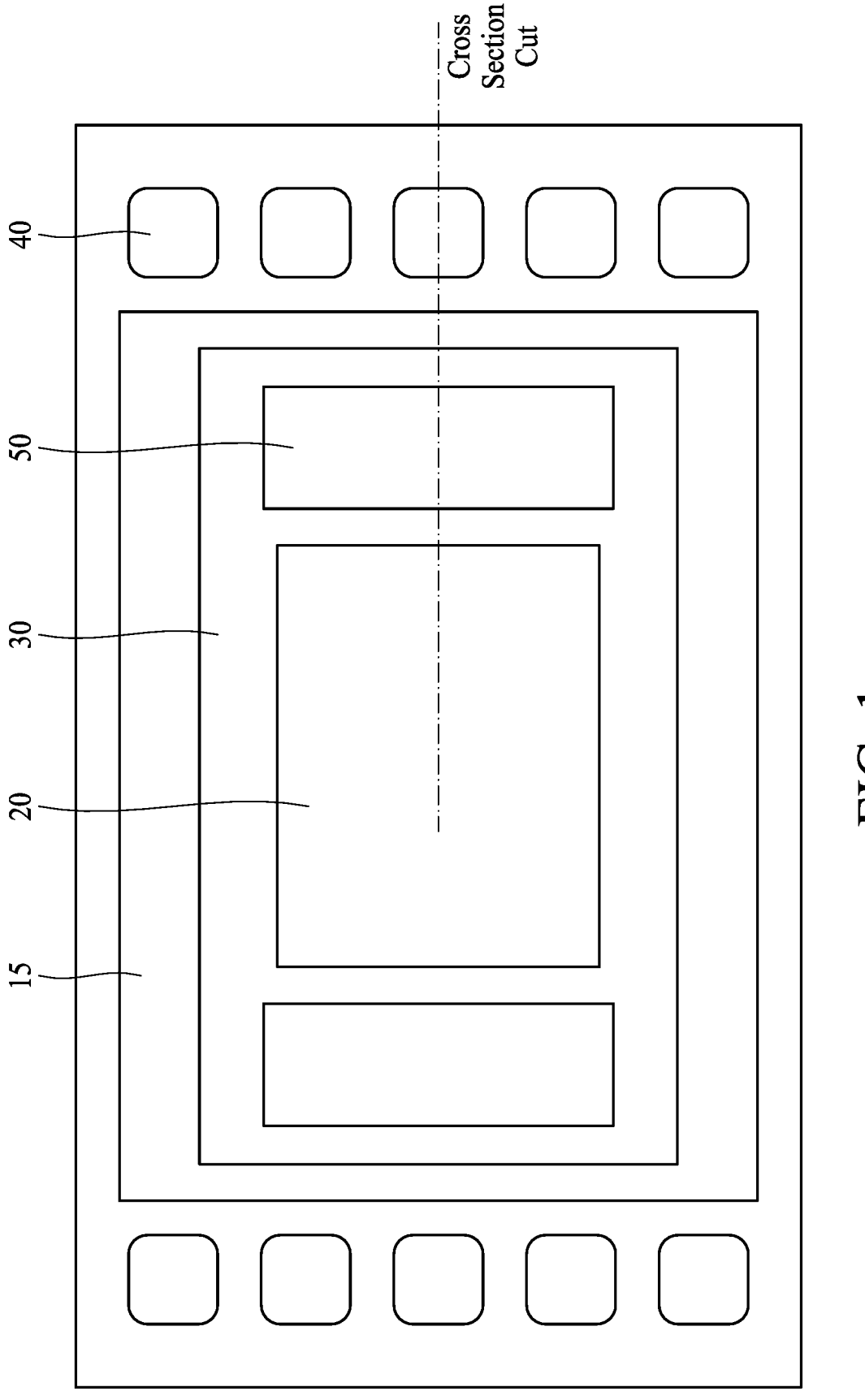
FIG. 1 is a plan or layout view illustrating a CMOS image sensor (CIS) according to an embodiment of the present disclosure.

FIG. 1 is a plan or layout view illustrating a CMOS image sensor (CIS) according to an embodiment of the present disclosure. The CMOS image sensor include a pixel area 20 in which a plurality of unit pixels are arranged in a matrix, and an optical isolation region 30 surrounding the pixel area 20. Further, the optical isolation area 30 is surrounded by a physical isolation area 15. In some embodiments, the CMOS image sensor includes a plurality of pad electrodes 40 for wiring to outside circuitry.

The CMOS image sensor includes one or more black level calibration (BLC) area 50 which blocks incident light and provide a reference dark voltage current. In some embodiments, as shown in FIG. 1, two BLC areas 50 are provides at the left and right sides of the pixel area 20 along the shorter sides of the pixel area 20. In other embodiments, two BLC areas 50 are provides at the top and bottom sides of the pixel area 20 along the longer sides of the pixel area 20. In certain embodiments, four BLC areas 50 are provides at the left, right, top and bottom sides of the pixel area 20 to surround the pixel area 20.

Figures 2A, 2B:
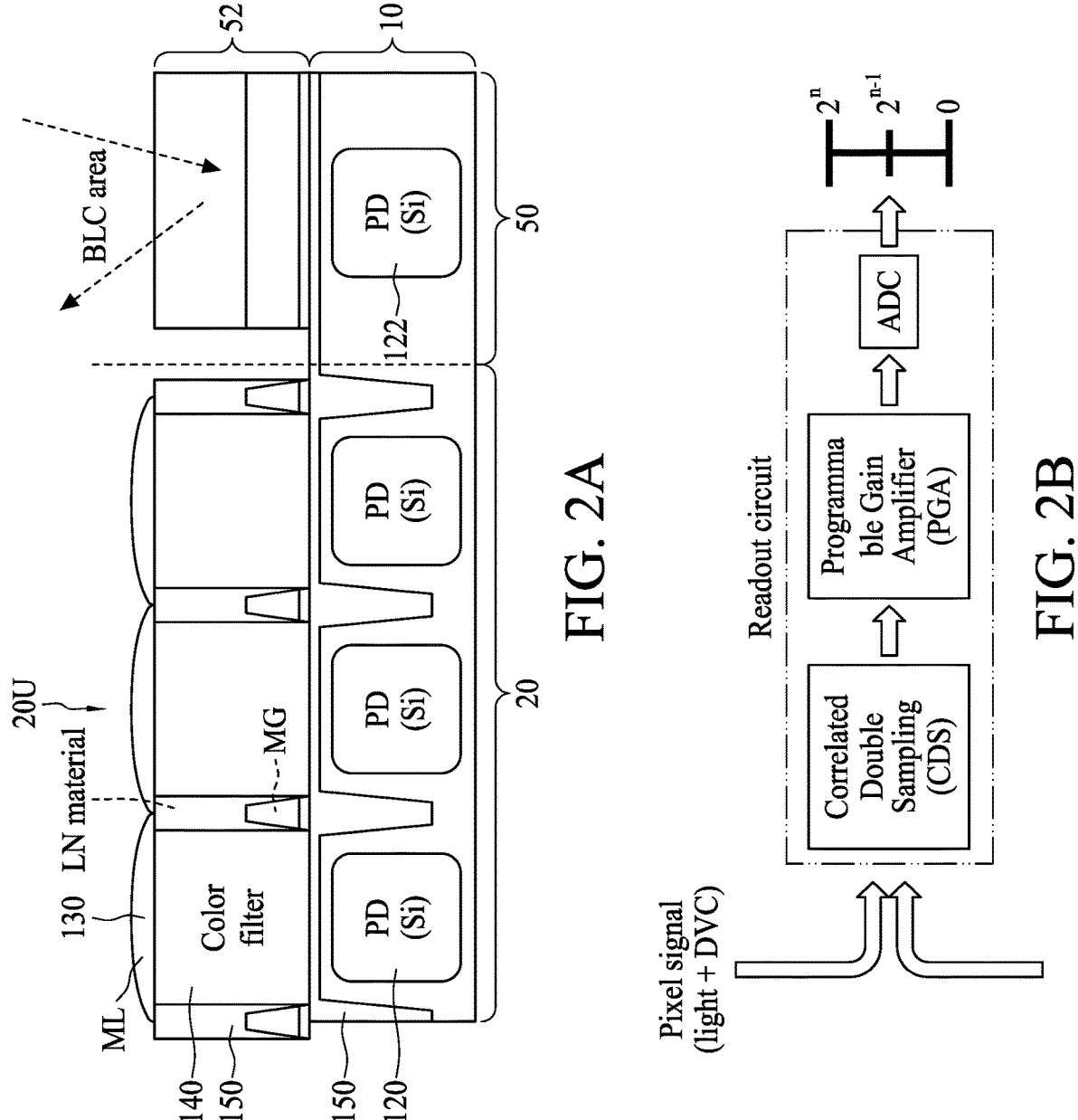
FIG. 2A shows a cross sectional view of a part of the CIS with a black level calibration area and FIG. 2B shows a signal processing of the CIS according to an embodiment of the present disclosure.

FIG. 2A shows a cross sectional view of a part of the CIS with a black level calibration (BLC) area and FIG. 2B shows a signal processing of the CIS according to an embodiment of the present disclosure. As shown in FIG. 2A, the pixel area 20 includes a plurality of unit pixels 20U, each of which includes a photo diode 120 formed in a substrate 10, a color filter 140 disposed over the photo diode 120 and a micro lens 130 disposed over the color filter 140. The color filters are separated by an isolation structure (wall structure) 150 and the photo diodes 120 are separated by a deep trench isolation (DTI) 150 formed in the substrate. In some embodiments, each unit pixel 20U has a square or a rectangular shape in plan view and surrounded by the isolation structure 150.

The BLC area 50 includes a dark voltage current sensing circuit including one or more photo diodes 122 and a light shield structure 52, which prevents the incident light from entering the photo diodes below the light shield structure. Accordingly, the photo diodes 122 in the BLC area 50 generates no photo-electric current, and provide only a background noise signal (i.e., DVC), which may be caused by a thermal effect. As shown in FIG. 2B, the signals from photo diodes 122 in the pixel area 20 include photo-electric signal and DVC. The DVC component of the signals from photo diodes 120 in the pixel area 20 is subtracted using the DVC measured at the BLC area which only includes the background noise signal, and the corrected signals are subjected to correlated double sampling, gain adjustment by a programmable gain amplifier and an AC converter in a readout circuit, to produce binary image signals.

Figures 3A, 3B:
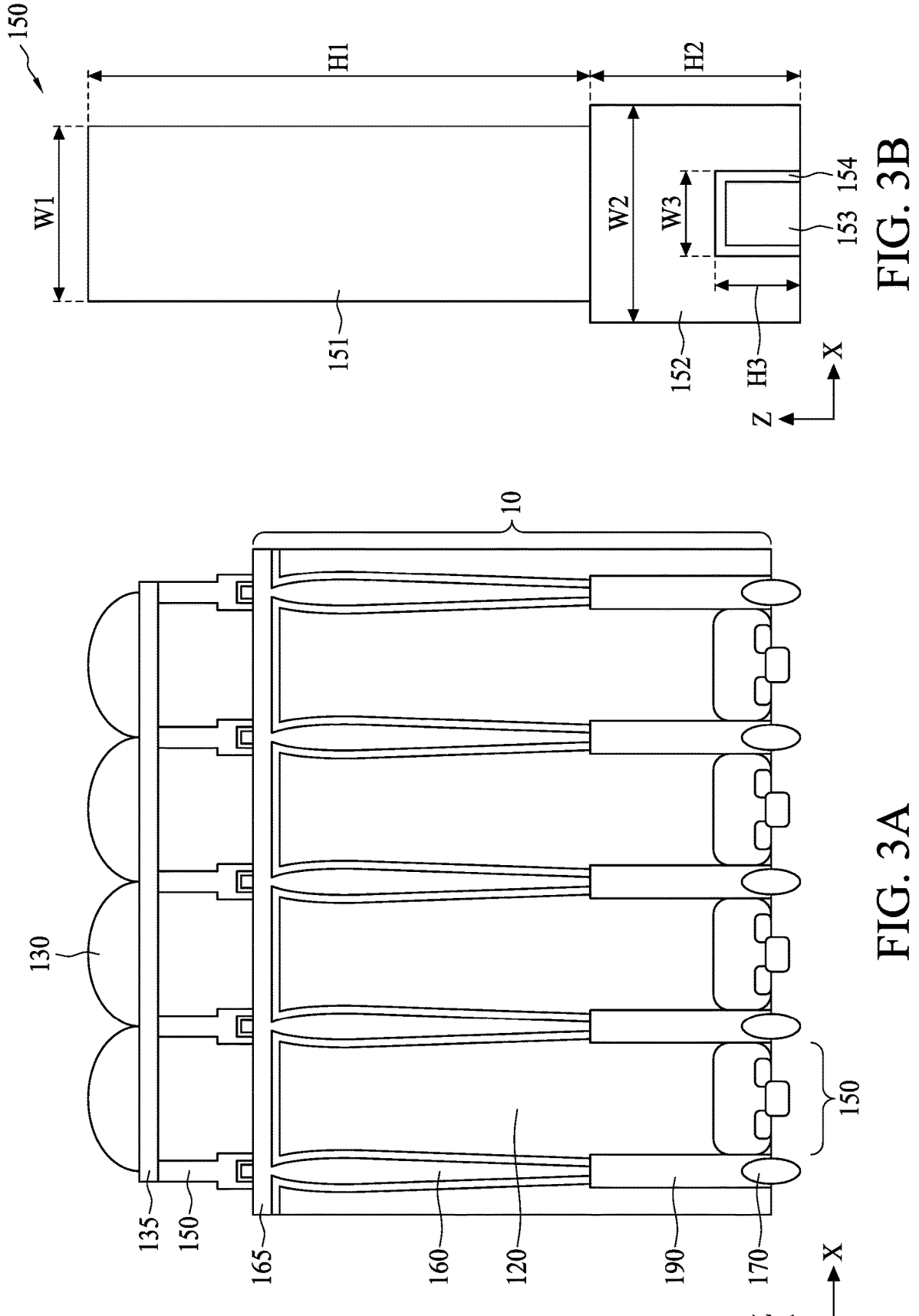
FIG. 3A shows a cross sectional view of a pixel area of a CIS according to an embodiment of the present disclosure.
FIG. 3B shows an enlarged cross sectional view of an isolation structure in the pixel area according to an embodiment of the present disclosure.

FIGS. 3A and 3B show a structure of the pixel area according to the present disclosure. FIG. 3A illustrates a cross sectional view of the pixel area 20 of the CMOS image sensor and FIG. 3B shows an enlarged view of the isolation structure 150 in accordance with an embodiment.

In some embodiments, the CMOS image sensor 100 includes a photodiode layer 120 formed in a Si substrate 10 having a first principal surface and an opposing second principal surface, a color filter 140 disposed over the second surface and substantially aligning with the photodiode 120, and a micro-lens 130 disposed over and aligning with the color filter 140. In some embodiments, a liner dielectric layer 135 is disposed between the color filter 140 and the micro-lens 130. The CMOS image sensor also includes a first isolation structure 150 to laterally separate adjacent color filters. In some embodiments, the CMOS image sensor includes a second isolation structure 160, which is a deep trench isolation filled with one or more dielectric materials, disposed in the semiconductor substrate 10 to laterally separate adjacent photodiodes 120. In some embodiments, the second isolation structure includes a first conformal layer made of aluminum oxide, hafnium oxide or tantalum oxide and a second filling layer made of silicon oxide. The both layers are also continuously disposed over the second surface of the substrate 10. In addition, the CMOS image sensor includes transistors 105 coupled to the photodiode 120 disposed on the first surface of the substrate 10, and a third isolation structure 170, which is a shallow trench isolation with an insulating material (e.g., silicon oxide), electrically separating one transistor from another transistor. In some embodiments, a fourth isolation structure 190, which is a doped region implanted with, for example, boron, disposed between and aligning with the second isolation structure 160 and the third isolation structure 170 along the Z direction (thickness direction of the substrate 10), functioning as an electrical isolation. In some embodiments, the depth of the second isolation structure 160 (DTI) is more than 1 μm and is in a range from about 1.5 μm to 6.0 μm in some embodiments. In some embodiments, the depth of the third isolation structure 170 (STI) is smaller than the depth of the second isolation structure 160 (e.g., less than 500 nm) and is in a range from about 100 nm to 200 nm in some embodiments.

The plurality of unit pixels are arranged in a matrix and are each defined by a grid of the first, second and/or third isolation structures in plan view. The color filters include three colors (e.g., RGB) arranged in a Bayer's pattern.

In some embodiments, the first isolation structure 150 includes a metal layer 153, a first dielectric layer 152 covering the metal layer 153 and a second dielectric layer 151 disposed over the first dielectric layer 152. In some embodiments, a cover layer 154 is disposed between the metal layer 153 and the first dielectric layer 152.

In some embodiments, the metal layer 153 is made of a metal material, such as W, Al, Cu, or Cr, or a metal alloy material (such as TiN). In some embodiments, each of the first and second dielectric layers 152, 151 includes a low-k dielectric material, and includes one or more of silicon oxide, SiOC, SiCN, SiOCN or a polymer.

In some embodiments, the refractive index $n1$ of the first dielectric layer 152 is different from the refractive index $n2$ of the second dielectric layer 151. In some embodiments, the refractive index values satisfy $1.0 < n1$, $n2 < 1.50$. In some embodiments, $n1 < n2$ and in other embodiments, $n1 > n2$. In some embodiments, the first and second dielectric layers are made of the same material. In some embodiments, both the refractive index $n1$ of the first dielectric grid 152 and the refractive index $n2$ of the second dielectric grid 151 are less than the refractive index $n$ of the color filters 140. In this way, total internal reflection in the color filters of the pixel image sensor array can be enhanced, and the quantum efficiency (QE) of the pixel image sensor array can thus be improved.

In some embodiments, a width W1 of the second dielectric layer 151 is in a range from about 50 nm to about 200 nm, and a height H1 of the second dielectric layer 151 is in a range from about 100 nm to about 1000 nm. In some embodiments, a width W2 of the first dielectric layer 152 is in a range from about 90 nm to about 300 nm, and a height H2 of the first dielectric layer 152 is in a range from about 100 nm to about 1000 nm. In some embodiments, a width W3 of the metal layer 153 is in a range from about 20 nm to about 80 nm, and a height H3 of the metal layer 153 is in a range from about 30 nm to about 500 nm. In some embodiments, a width W1 is less than the width W2. In some embodiments, the height H1 is greater than the height H2. In some embodiments, a ratio of H1 to H2 (H1/H2) is in a range from about 1.2 to about 10. In this way, a space or a room of each color filter 140 can be enlarged, and the quantum efficiency (QE) of each unit pixel of the pixel image sensor array can thus be enhanced.

Figures 4A, 4B:
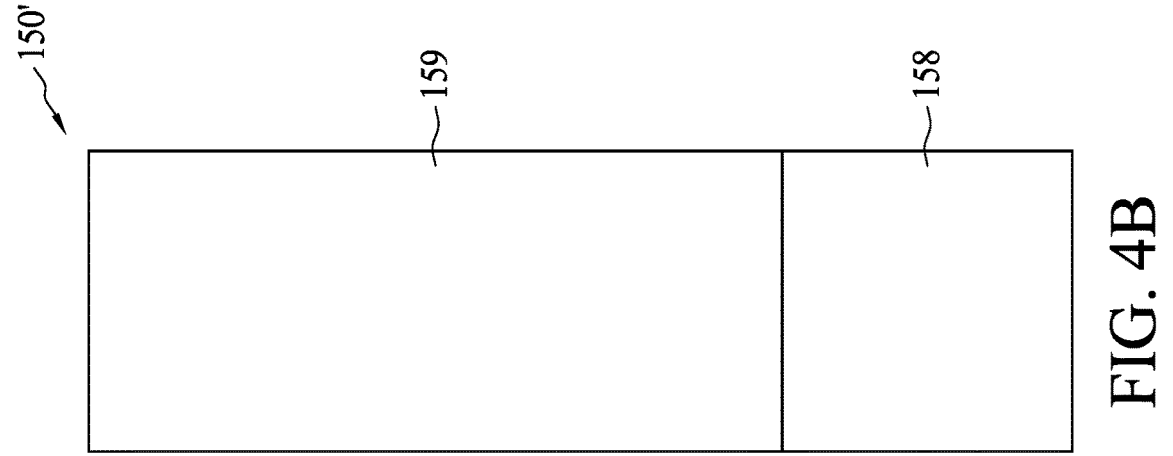
FIG. 4A shows a cross sectional view of a pixel area of a CIS according to an embodiment of the present disclosure.
FIG. 4B shows an enlarged cross sectional view of an isolation structure in the pixel area according to an embodiment of the present disclosure.

FIGS. 4A and 4B show a structure of the pixel area according to the present disclosure. FIG. 4A illustrates a cross sectional view of the pixel area 20 of the CMOS image sensor and FIG. 4B shows an enlarged view of the isolation structure 150' in accordance with an embodiment.

In some embodiments, the first isolation structure 150' includes a metal layer 158 and a dielectric layer 159, forming a composite metal grid shown in FIG. 4A. In some embodiments, the metal layer 158 is made of a metal material, such as W, Al, Cu, or Cr, or a metal alloy material (such as TiN). In some embodiments, each of the dielectric layer 159 includes a low-k dielectric material, and includes one or more of silicon oxide, SiOC, SiCN, SiOCN or a polymer. The width of the dielectric layer 159 is substantially the same as the width of the metal layer 158 and is in a range from about 90 nm to about 300 nm, in some embodiments.

Figure 5A:
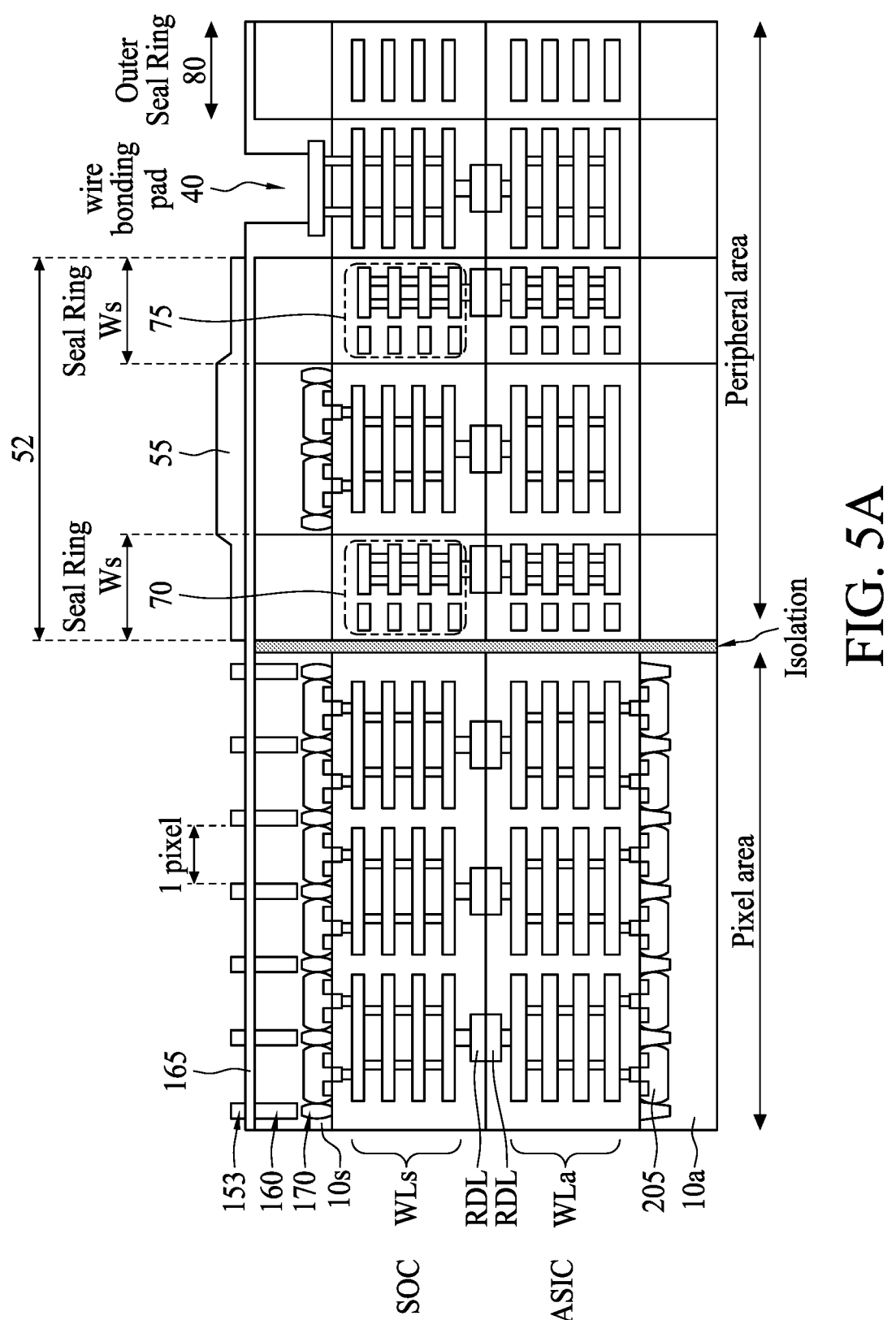
FIG. 5A shows a cross sectional view and FIG. 5B is a plan view of an CIS integrated with another LSI according to an embodiment of the present disclosure.
Figure 5B:
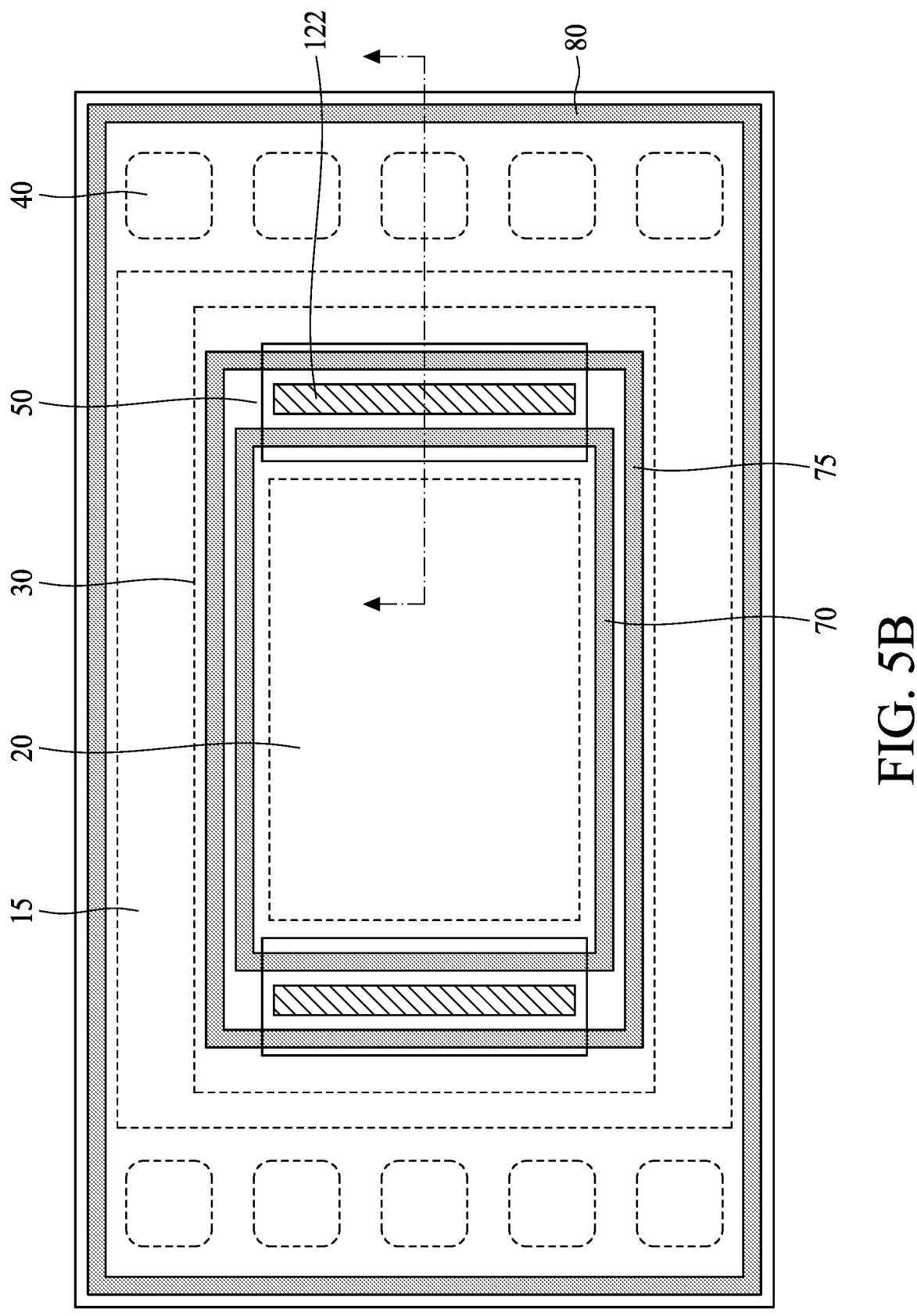

FIG. 5A shows a cross sectional view and FIG. 5B is a plan view of an CIS integrated with another LSI according to an embodiment of the present disclosure.

In some embodiments, the CMOS image sensor includes a pixel area and peripheral area separated by an isolation structure (e.g., silicon oxide layer). The pixel area of the CMOS image sensor is provided with a first circuit SOC including a substrate 10s and various functions. Multiple wiring layers WLs formed in dielectric layers are provided over the photodiodes of the pixel area. A second circuit ASIC includes a substrate 10a provided with a plurality of transistors 205 and multiple wiring layers WLa formed in dielectric layers over the transistors. In some embodiments, the first circuit substrate SOC is coupled to the second circuit substrate through connection patterns RDL. The structure of the pixel area is consistent with the structure shown in FIGS. 3A and 3B, where the first and second dielectric layers of the first isolation structure and some other elements are omitted in FIG. 5A.

As show in FIG. 5A, one or more photodiodes and transistors are provided under the light shielding structure 52 having a metal layer 55. Further, a first inner seal ring structure 70 and a second inner seal ring structure 75 are disposed to surround the pixel area as shown in FIG. 5B. The first and second inner seal ring structures 70, 75 pass through the area under the light shielding structure 52 as shown in FIGS. 5A and 5B. Further, an outer seal ring structure 80 is provided along the circumference of the CMOS image sensor, outside of which is a scribe line.

The seal ring structures include a plurality of conductive wire patterns and vias connecting vertically adjacent wire patterns. In some embodiments, each seal ring structure includes two or more ring structures. In some embodiments, the seal ring structures formed in the first circuit substrate SOC is coupled to the seal ring structures formed in the second circuit substrate ASIC. In some embodiments, the first and second inner seal ring structures are coupled to a fixed potential (e.g., the ground) or electrically floating (not coupled to a fixed potential). In some embodiments, the width Ws of the inner seal ring structures is in a range from about 10 μm to 40 μm.

In some embodiments, the metal layer 55 of the light shield structure 52 has a thicker portion above the photo diodes, and thinner portions having smaller thicknesses than the thicker portion above the first and second inner seal ring structures, respectively.

In some embodiments, the first circuit substrate includes the photo diode, one of which terminal is coupled to a first potential (e.g. the ground). The photo carriers generated in the photo diodes are accumulated in the floating diffusion node through a transfer gate (transistor). The floating diffusion node is also coupled to the second potential through a switching transistor and a reset transistor. The gates of the transfer transistor, the switching transistor and the reset transistor is provided with voltages (signals), controlled by a driving or readout circuit. The voltage of the floating diffusion node is coupled to a gate of a source-follower transistor of which drain is coupled to the second potential and source is coupled to the drain of a row select transistor, to which gate the potential is applied.

In some embodiments, the output from the row select transistor is provided to the second circuit substrate though the connection pattern RDL shown in FIG. 5A. The circuitry of the second circuit substrate includes a bias transistor coupled to a third potential and to the connection pattern (output of the row select transistor), and the output from the row select transistor is also coupled to the switch control transistor. The output from the row select transistor is read out as $V_{OUT}$ through a global shutter function circuit, which includes a switch transistor, a metal-insulator-metal (MIM) capacitor (or memory), a source-follower transistor, and a row select transistor. The MIM capacitor is coupled to a fourth potential.

In some embodiments, multiple global shutter function circuits are provided, at least one of which is for a background image signal, and the other is for a real-time image signal. In some embodiments, three or more global shutter function circuits are provided.

Figure 6:
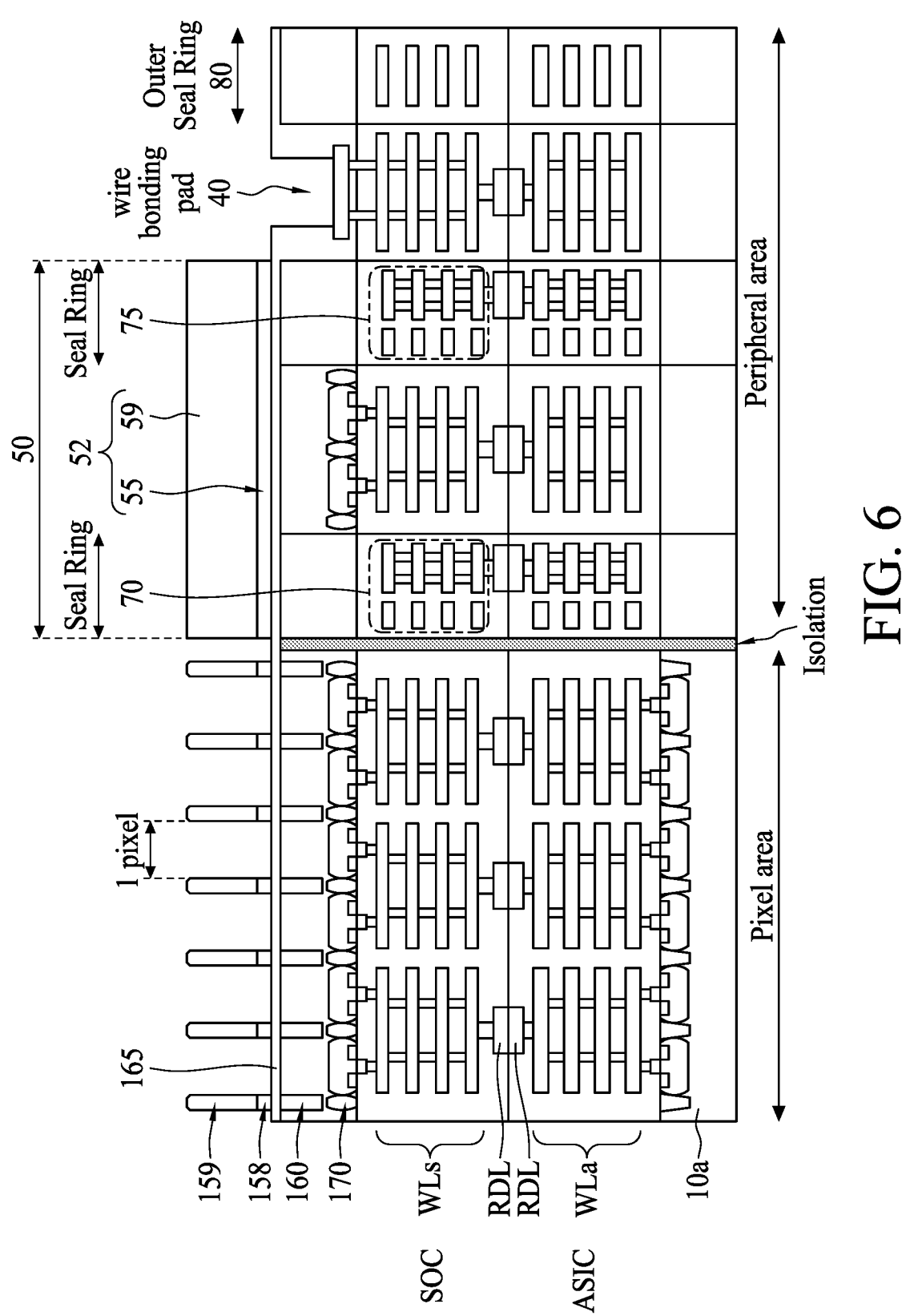
FIGS. 6 and 7 show cross sectional views of a CMOS image sensor in accordance with embodiments of the present disclosure.
Figure 7:
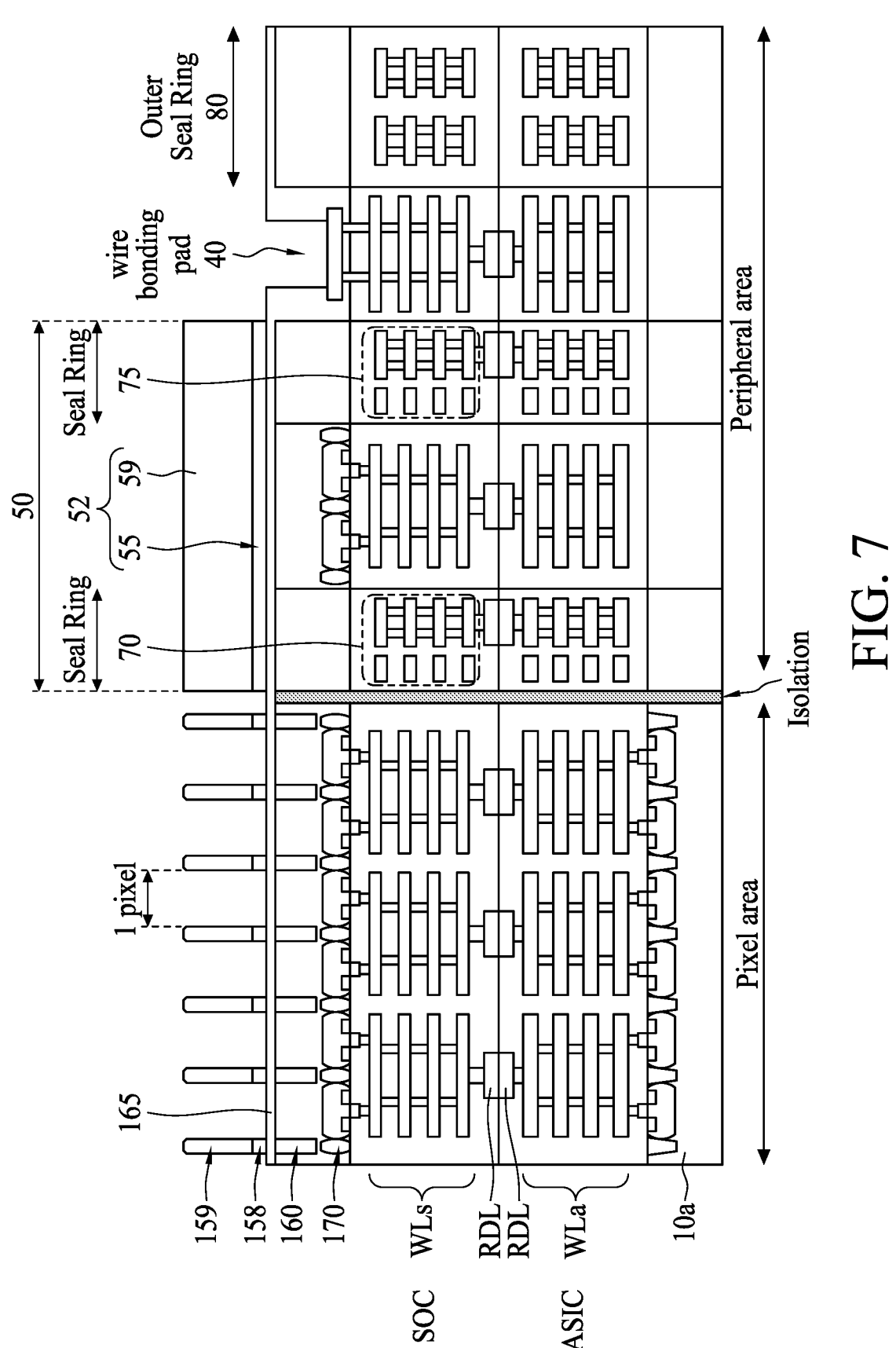

FIGS. 6 and 7 show cross sectional views of a CIS integrated with another LSI according to embodiments of the present disclosure. The structure of the pixel area is consistent with the structure shown in FIGS. 4A and 4B in which a metal layer 158 (corresponding to metal layer 153 explained above) is included in a composite metal grid, where some other elements of FIGS. 4A and 4B are omitted in FIGS. 6 and 7.

In some embodiments, the light shielding structure 52 has a same structure as the first isolation structure shown in FIGS. 4A and 4B having a metal layer 55 same as the metal layer 158 and a dielectric layer 59 same as the dielectric layer 159 having a constant thickness. Further, in FIG. 7, two outer seal ring structures 80 are provided, while one outer seal ring structure is provided in FIG. 6.

Figure 8A:
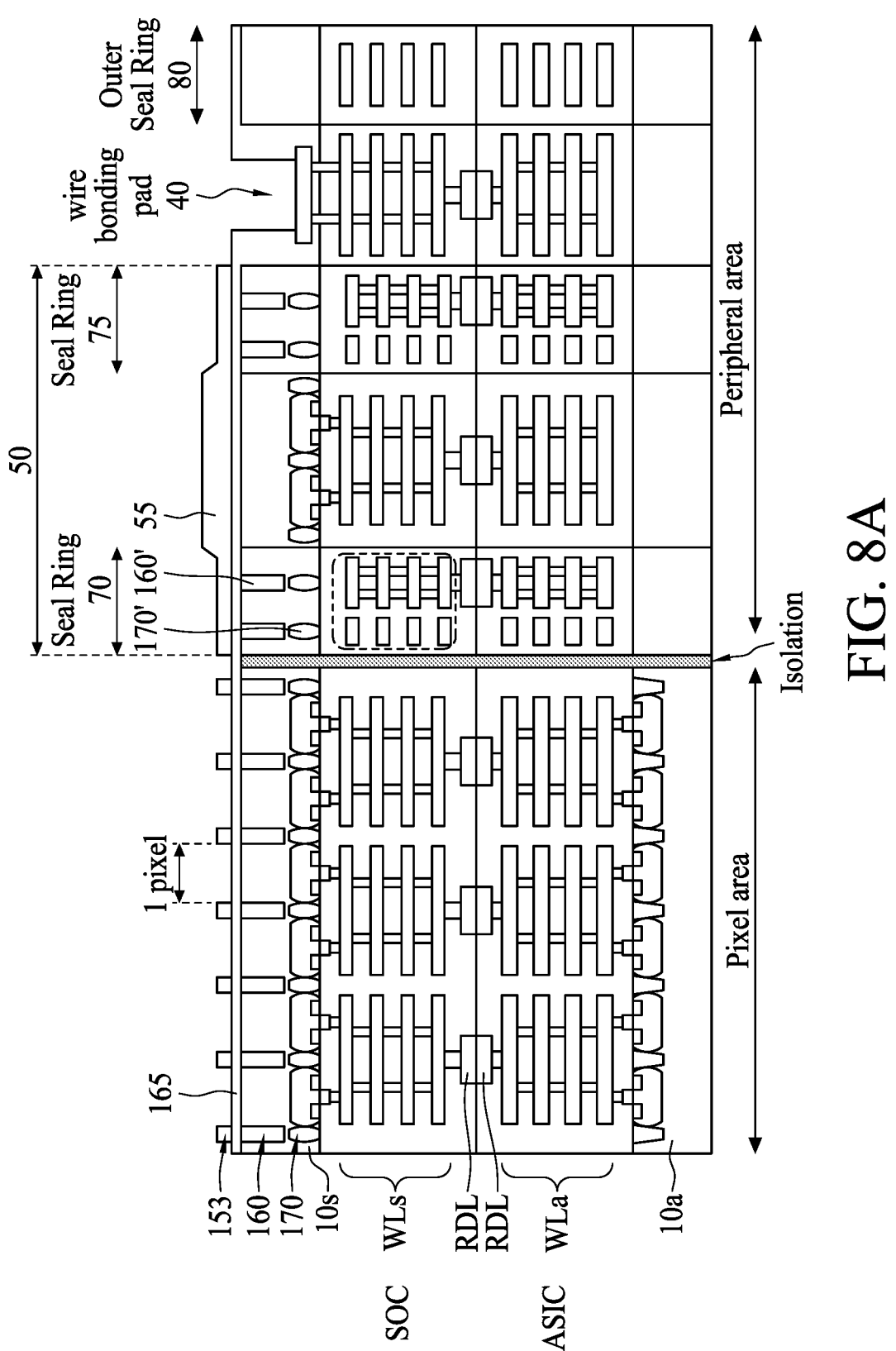
FIGS. 8A and 8B show cross sectional views of a CMOS image sensor in accordance with embodiments of the present disclosure.
Figure 8B:
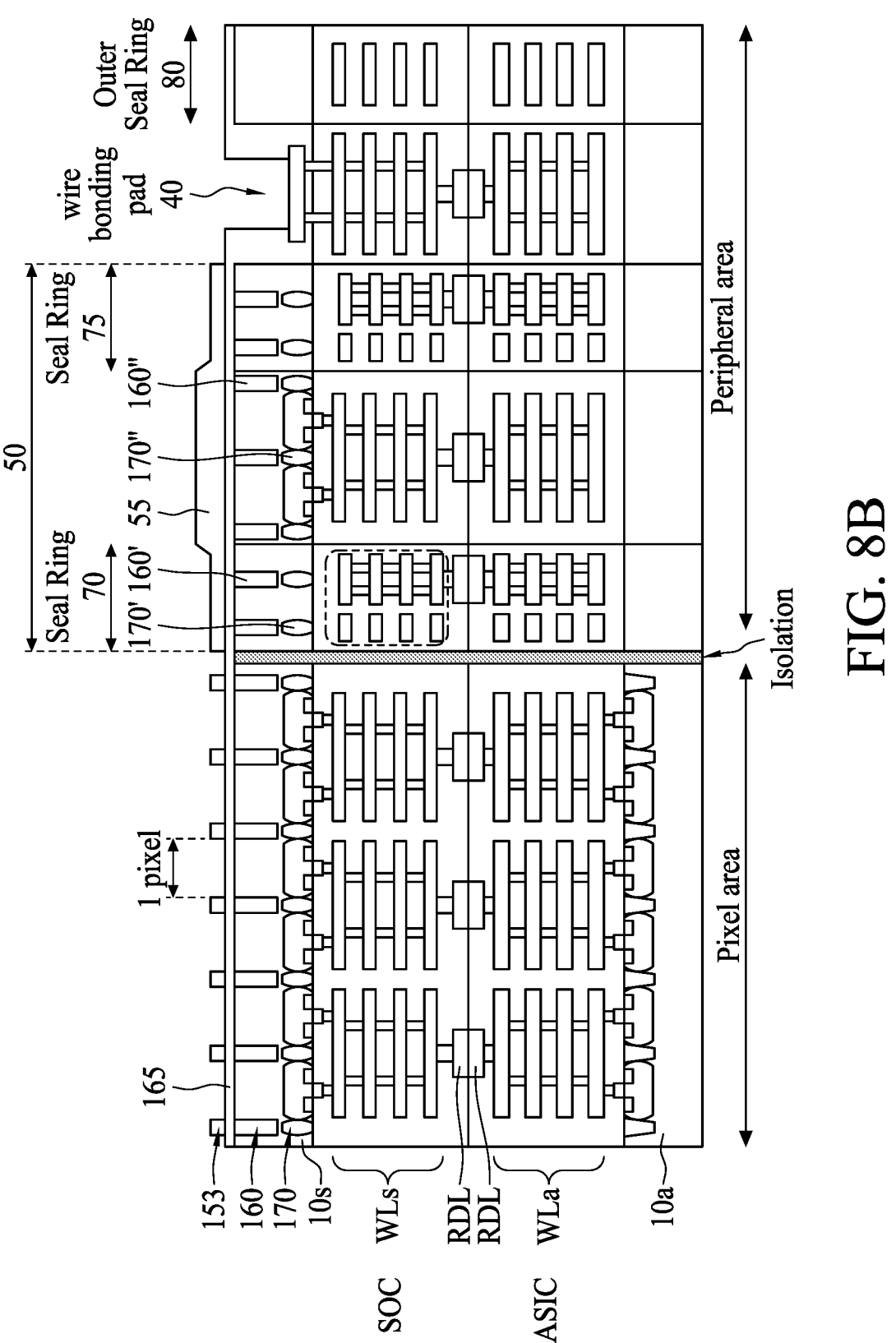

FIGS. 8A and 8B show cross sectional views of an CIS integrated with another LSI according to embodiments of the present disclosure.

In some embodiments, as shown in FIGS. 8A and 8B, most of the structures are consistent with the structure shown in FIG. 5A. FIGS. 8A and 8B include additional second isolation structures 160' (deep trench isolation) disposed over the first and second inner seal ring structures 70, 75 under the light shielding structure 52. Further, additional third isolation structures 170' (shallow trench isolation) are disposed over the first and second inner seal ring structures 70, 75 under the light shielding structure 52. These additional isolation structures can provide an additional optical isolation for the black level calibration area 50. In some embodiments, additional isolation structures (doped regions) similar to the fourth isolation structure 190 shown in FIG. 3A are also provided between the additional second isolation structures 160' and the additional third isolation structures 170'. In some embodiments, no additional second and third isolation structures are provided over the outer seal ring structure 80.

In some embodiments, one or more of the inner seal ring structures in the first circuit substrate is coupled to seal ring structures in the second circuit substrate. In other embodiments, one or more of the inner seal ring structures in the first circuit substrate is not coupled to seal ring structures in the second circuit substrate.

In some embodiments, the additional second and/or third isolation structures 160', 170' have a grid structure in plan view similar to the second and/or third isolation structures 160, 170 in the pixel area. In some embodiments, the additional second and/or third isolation structures 160', 170' have a line pattern in plan view. In some embodiments, the additional second and/or third isolation structures 160', 170' are disposed only under the light shielding structure 52. In other embodiments, the additional second and/or third isolation structures 160', 170' have a ring or frame shape in plan view similar to the inner seal ring structures surrounding the pixel area.

Further, in some embodiments, as shown in FIG. 8B, additional second isolation structures 160" are disposed over the photo diodes 120 under the light shielding structure 52 to isolate the adjacent photo diodes, and additional third isolation structures 170" are disposed to isolate adjacent transistors for the photo diodes. In some embodiments, additional fourth isolation structures (doped regions) are also provided between the additional second isolation structures and third isolation structures. These additional isolation structures can provide an additional optical isolation for the black level calibration area 50.

In some embodiments, the additional second and/or third isolation structures 160", 170" have a grid structure in plan view similar to the second and/or third isolation structures 160, 170 in the pixel area. In some embodiments, the additional second and/or third isolation structures 160", 170" have a line pattern in plan view. In some embodiments, the additional second and/or third isolation structures 160", 170" are disposed only under the light shielding structure 52. In other embodiments, the additional second and/or third isolation structures 160", 170" have a ring or frame shape in plan view similar to the inner seal ring structures surrounding the pixel area.

Figure 9A:
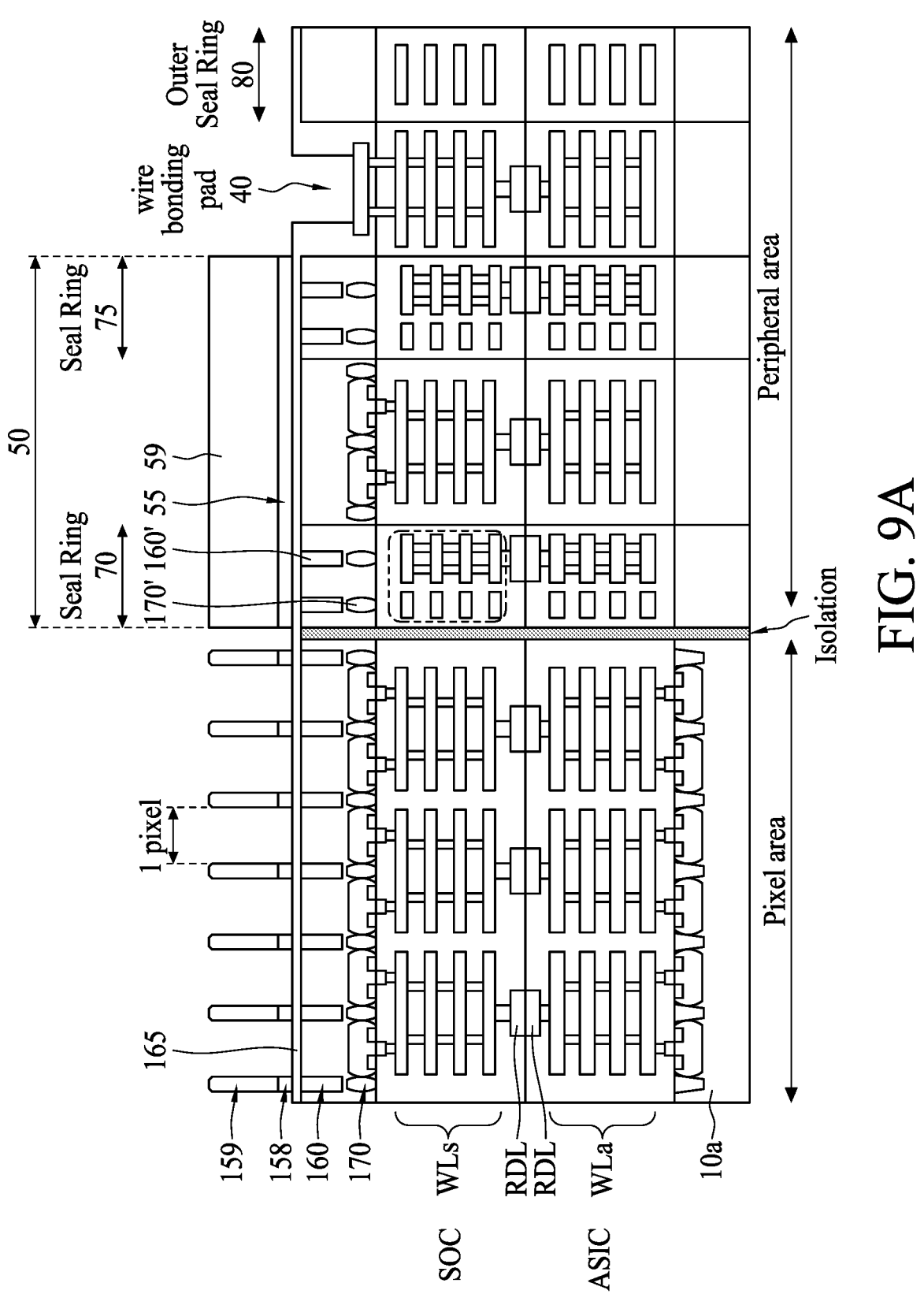
FIGS. 9A and 9B show cross sectional views of a CMOS image sensor in accordance with embodiments of the present disclosure.
Figure 9B:
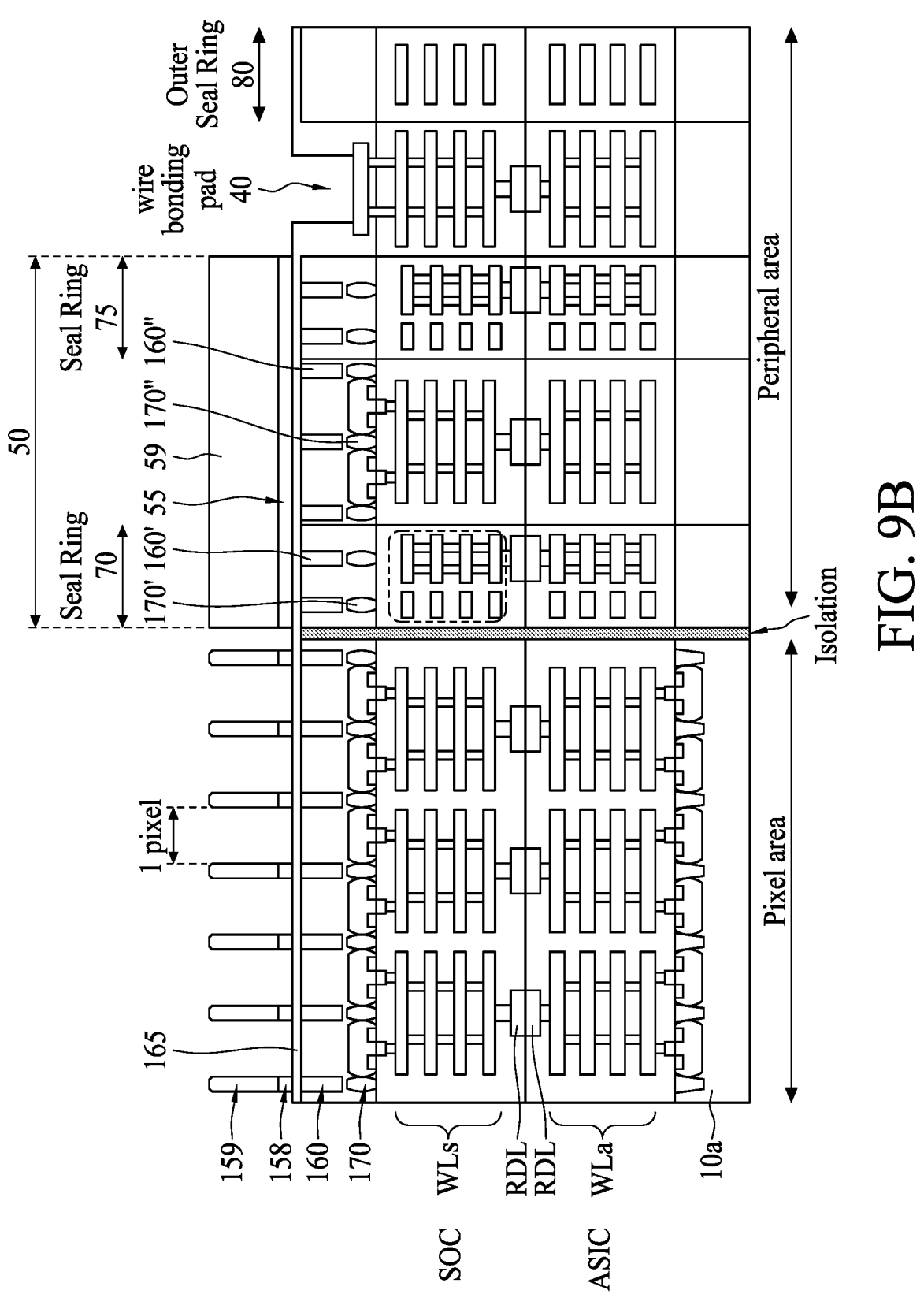

FIGS. 9A and 9B show cross sectional views of an CIS integrated with another LSI according to embodiments of the present disclosure.

In some embodiments, as shown in FIGS. 9A and 9B, most of the structures are consistent with the structure shown in FIG. 6. FIGS. 9A and 9B include additional second isolation structures 160' (deep trench isolation) disposed over the first and second inner seal ring structures 70, 75 under the light shielding structure 52. Further, additional third isolation structures 170' (shallow trench isolation) are disposed over the first and second inner seal ring structures 70, 75 under the light shielding structure 52. These additional isolation structures can provide additional optical isolation for the black level calibration area 50. In some embodiments, additional fourth isolation structures (doped regions) are also provided between the additional second isolation structures and third isolation structures. In some embodiments, no additional second and third isolation structures are provided over the outer seal ring structure 80.

In some embodiments, the additional second and/or third isolation structures 160', 170' have a grid structure in plan view similar to the second and/or third isolation structures 160, 170 in the pixel area. In some embodiments, the additional second and/or third isolation structures 160', 170' have a line pattern in plan view. In some embodiments, the additional second and/or third isolation structures 160', 170' are disposed only under the light shielding structure 52. In other embodiments, the additional second and/or third isolation structures 160', 170' have a ring or frame shape in plan view similar to the inner seal ring structures surrounding the pixel area.

Further, in some embodiments, as shown in FIG. 9B, additional second isolation structures 160" are disposed over the photo diodes 120 under the light shielding structure 52 to isolate the adjacent photo diodes, and additional third isolation structures 170" are disposed to isolate adjacent transistors for the photo diodes. In some embodiments, additional fourth isolation structures (doped regions) are also provided between the additional second isolation structures and third isolation structures. These additional isolation structures can provide an additional optical isolation for the black level calibration area 50.

In some embodiments, the additional second and/or third isolation structures 160", 170" have a grid structure in plan view similar to the second and/or third isolation structures 160, 170 in the pixel area. In some embodiments, the additional second and/or third isolation structures 160", 170" have a line pattern in plan view. In some embodiments, the additional second and/or third isolation structures 160", 170" are disposed only under the light shielding structure 52. In other embodiments, the additional second and/or third isolation structures 160", 170" have a ring or frame shape in plan view similar to the inner seal ring structures surrounding the pixel area.

Figure 10A:
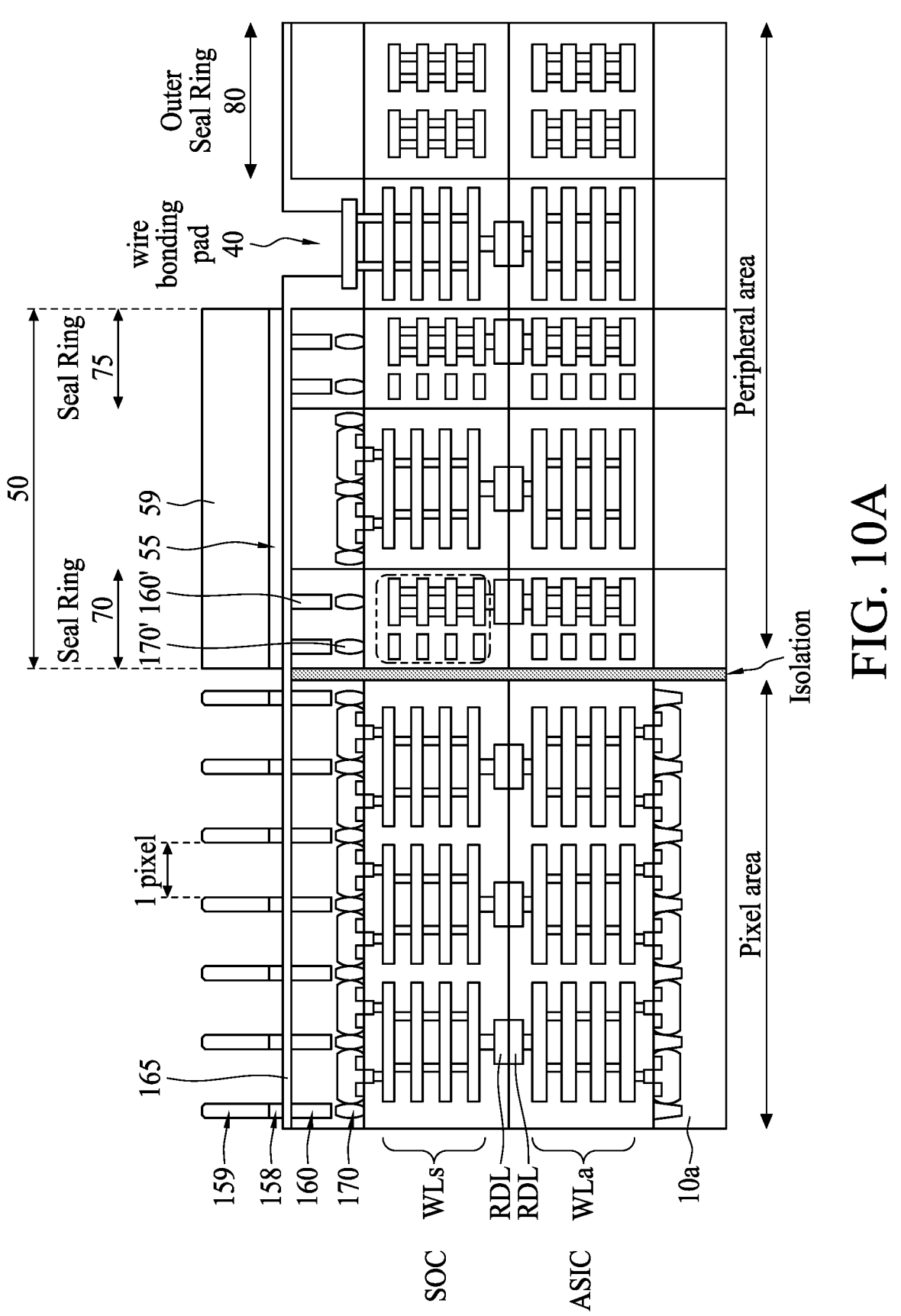
FIGS. 10A and 10B show cross sectional views of a CMOS image sensor in accordance with embodiments of the present disclosure.
Figure 10B:
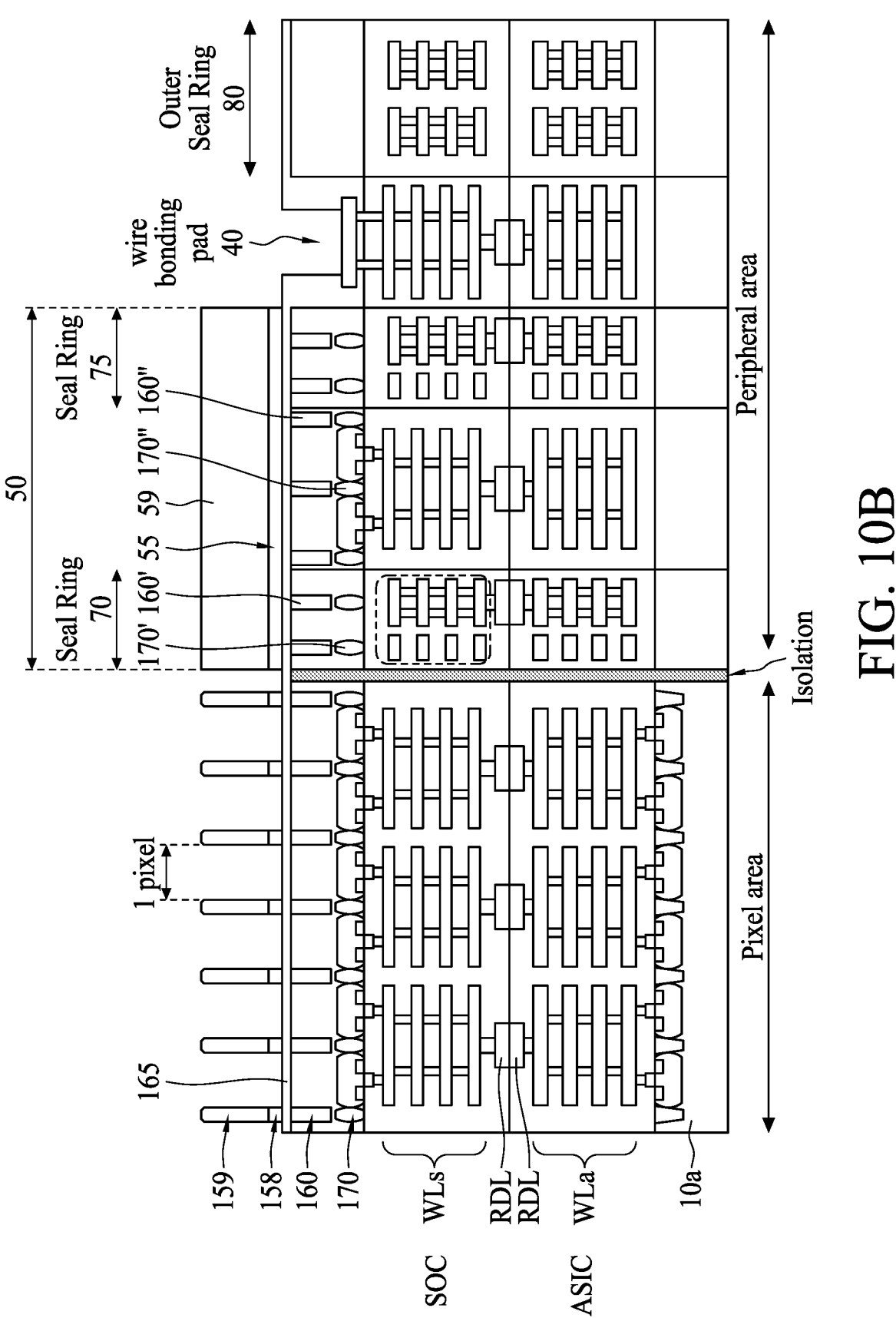

FIGS. 10A and 10B show cross sectional views of a CIS integrated with another LSI according to embodiments of the present disclosure.

In some embodiments, as shown in FIGS. 10A and 10B, most of the structures are consistent with the structure shown in FIG. 7. FIGS. 10A and 10B include additional second isolation structures 160' (deep trench isolation) disposed over the first and second inner seal ring structures 70, 75 under the light shielding structure 52. Further, additional third isolation structures 170' (shallow trench isolation) are disposed over the first and second inner seal ring structures 70, 75 under the light shielding structure 52. These additional isolation structures can provide an additional optical isolation for the black level calibration area 50. In some embodiments, additional fourth isolation structures (doped regions) are also provided between the additional second isolation structures and third isolation structures. In some embodiments, no additional second and third isolation structures are provided over the outer seal ring structure 80.

In some embodiments, the additional second and/or third isolation structures 160', 170' have a grid structure in plan view similar to the second and/or third isolation structures 160, 170 in the pixel area. In some embodiments, the additional second and/or third isolation structures 160', 170' have a line pattern in plan view. In some embodiments, the additional second and/or third isolation structures 160', 170' are disposed only under the light shielding structure 52. In other embodiments, the additional second and/or third isolation structures 160', 170' have a ring or frame shape in plan view similar to the inner seal ring structures surrounding the pixel area.

Further, in some embodiments, as shown in FIG. 10B, additional second isolation structures 160" are disposed over the photo diodes 120 under the light shielding structure 52 to isolate the adjacent photo diodes, and additional third isolation structures 170" are disposed to isolate adjacent transistors for the photo diodes. In some embodiments, additional fourth isolation structures (doped regions) are also provided between the additional second isolation structures and third isolation structures. These additional isolation structures can provide an additional optical isolation for the black level calibration area 50.

In some embodiments, the additional second and/or third isolation structures 160", 170" have a grid structure in plan view similar to the second and/or third isolation structures 160, 170 in the pixel area. In some embodiments, the additional second and/or third isolation structures 160", 170" have a line pattern in plan view. In some embodiments, the additional second and/or third isolation structures 160", 170" are disposed only under the light shielding structure 52. In other embodiments, the additional second and/or third isolation structures 160", 170" have a ring or frame shape in plan view similar to the inner seal ring structures surrounding the pixel area.

Figure 11A:
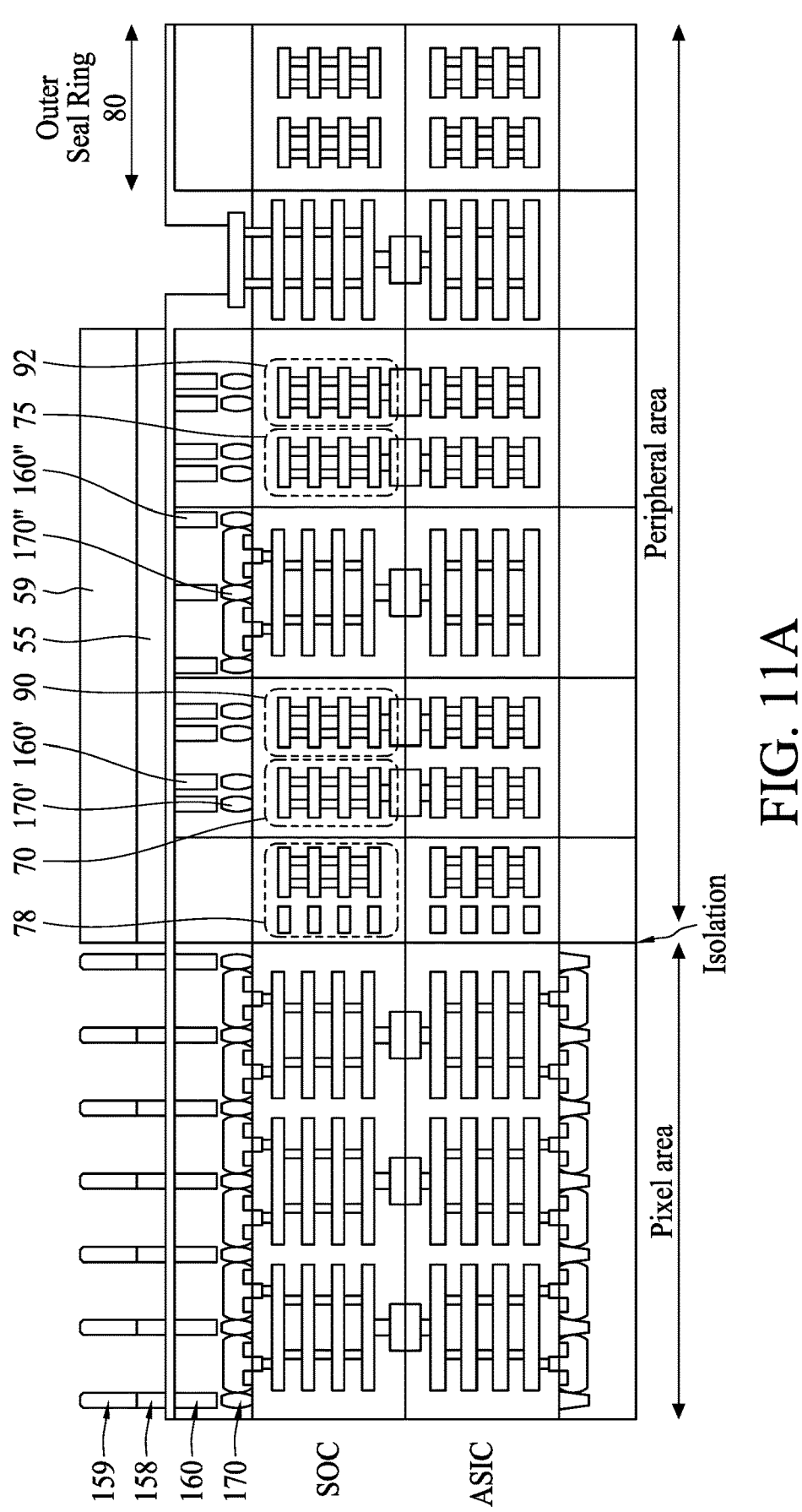
FIGS. 11A and 11B show cross sectional views and FIG. 11C shows a plan view of a CMOS image sensor in accordance with embodiments of the present disclosure.
Figure 11B:
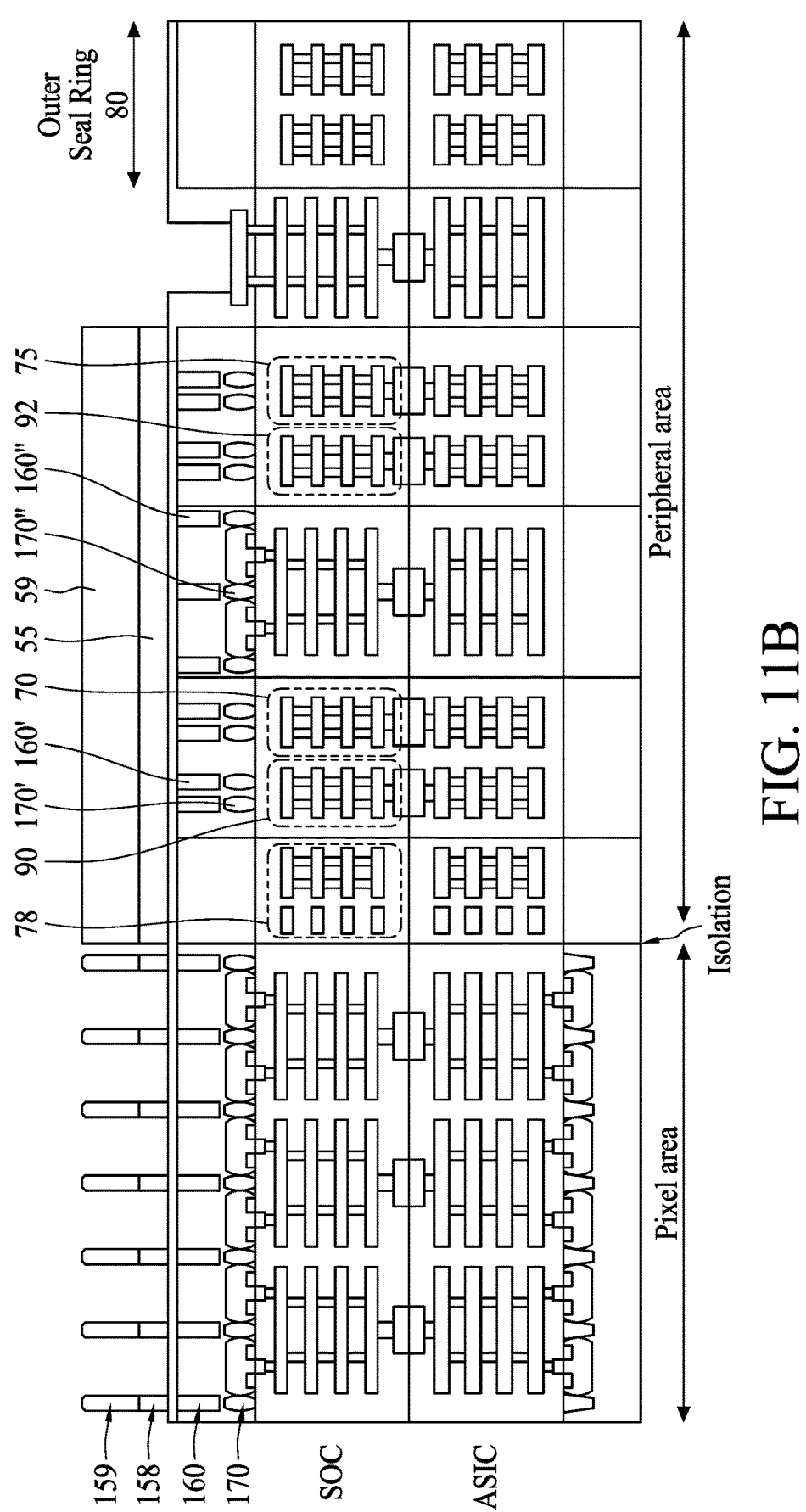

FIGS. 11A and 11B show cross sectional views of a CIS integrated with another LSI according to embodiments of the present disclosure.

In some embodiments, as shown in FIGS. 11A and 11B, most of the structures are consistent with the structure shown in FIGS. 7, 10A and/or 10B. In FIGS. 11A and 11B additional field barrier structures 90, 92 are disposed adjacent to the inner seal ring structures 70, 75 under the light shielding structure 52. Further, one or more additional dummy ring structures 78 are disposed between the field barrier structure and/or the inner seal ring structure and the pixel area. In FIG. 11B, the locations of the field barrier structures 90, 92 are switched with the locations of the inner seal ring structures 70, 75.

Figure 11C:
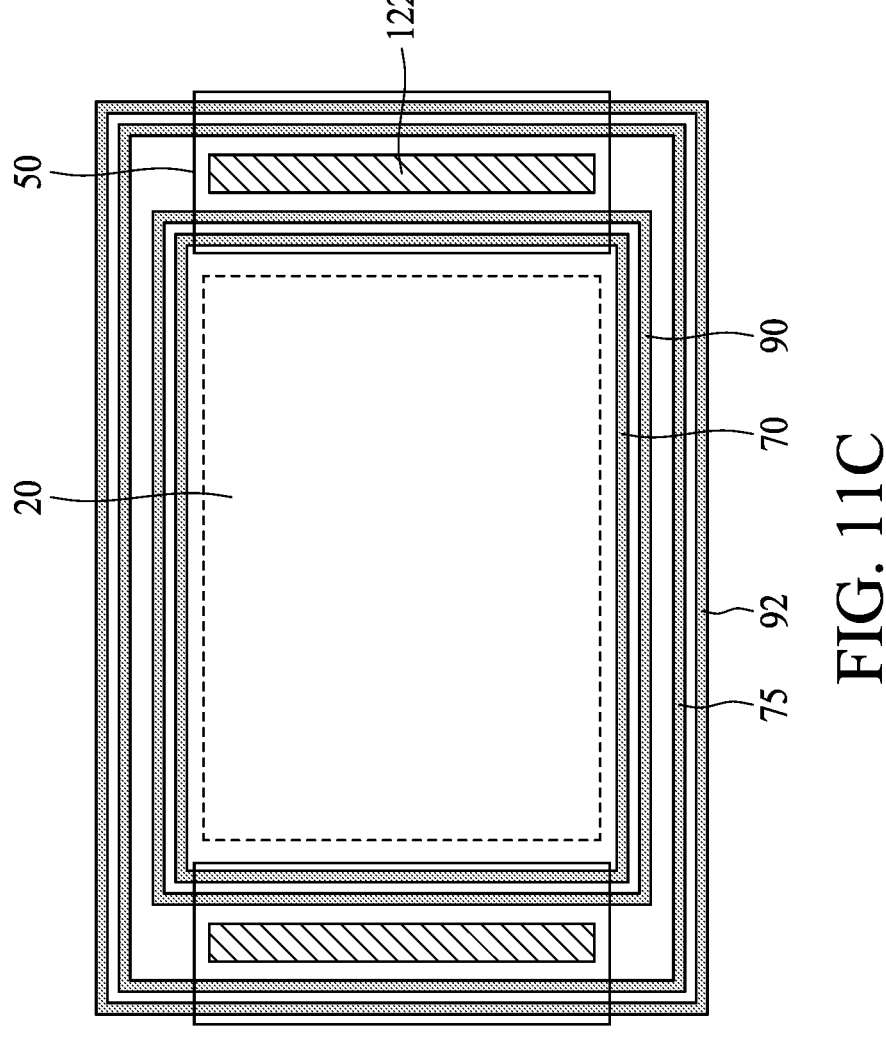

The field barrier structures 90, 92 have substantially the same structure (in terms of the wiring and via patterns in the vertical direction) as the inner seal ring structures 70, 75 in some embodiments. In other embodiments, the field barrier structures 90, 92 have a different structure than the inner seal ring structures 70, 75. The outer peripheral size of the field barrier structures in plan view is different from that of the inner seal ring structures as shown in FIG. 11C, which corresponds to FIG. 11A. These additional field barrier structures can provide an additional optical isolation for the black level calibration area 50. In some embodiments, one or more of the barrier structures in the first circuit substrate is coupled to barrier structures in the second circuit substrate. In other embodiments, one or more of the barrier structures in the first circuit substrate is not coupled to barrier structures in the second circuit substrate.

In some embodiments, no additional second and third isolation structures are provided over the dummy seal ring structures 78.

Figure 12A:
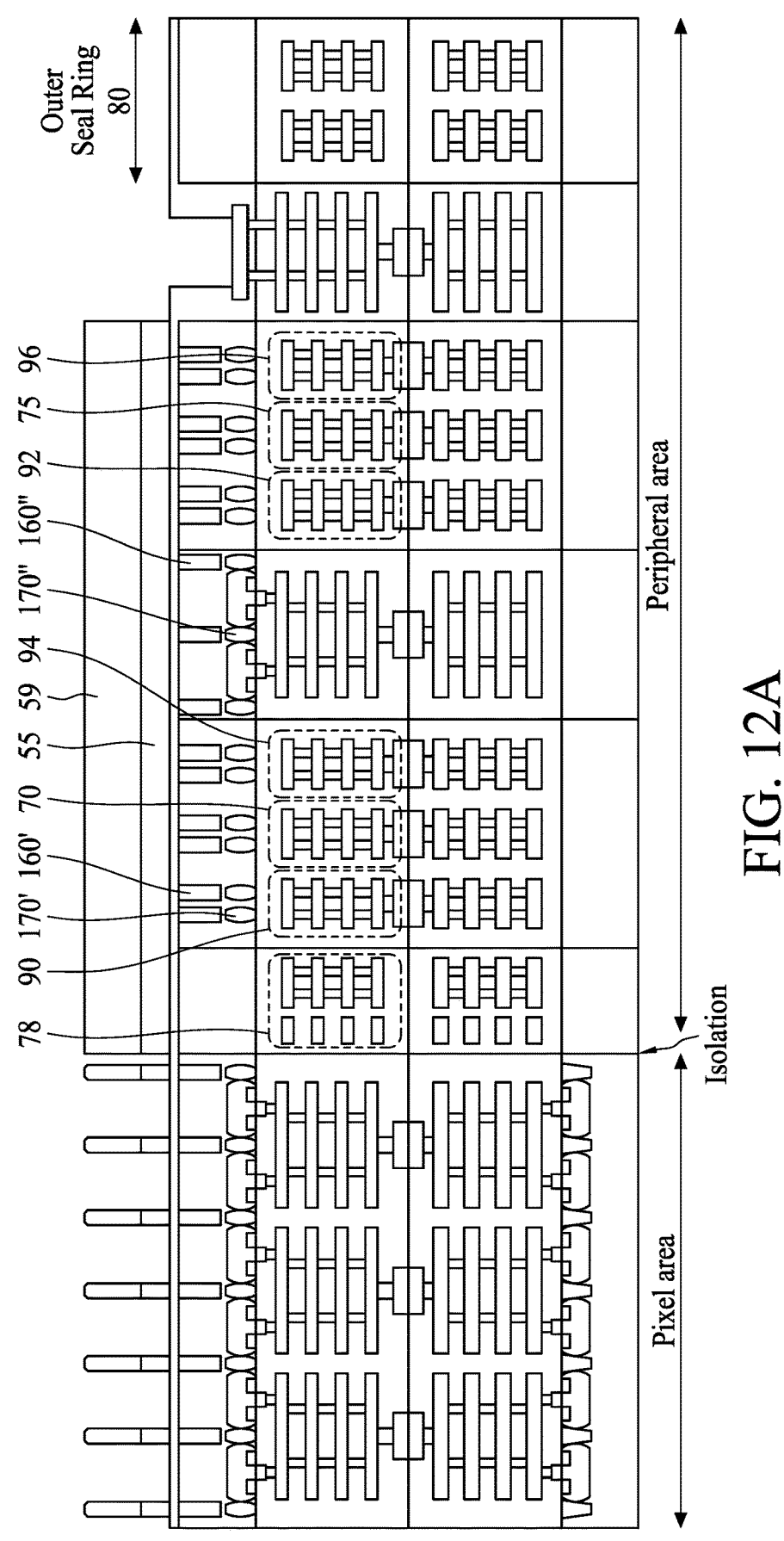
FIG. 12A shows a cross sectional view and FIG. 12B shows a plan view of a CMOS image sensor in accordance with embodiments of the present disclosure.
Figure 12B:
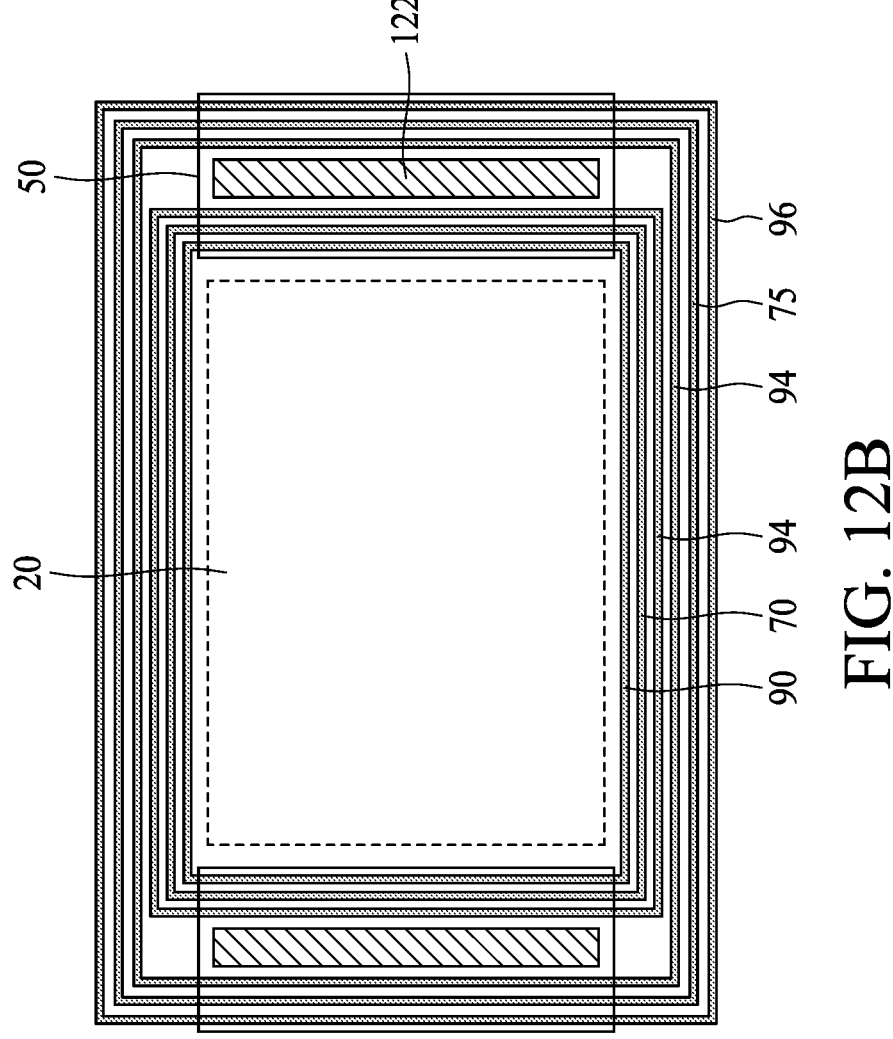

In some embodiments, as shown in FIGS. 12A and 12B, two field barrier structures 92, 94 and 96 are disposed to sandwich the first and second inner seal ring structures 70, 75, respectively.

Figure 13:
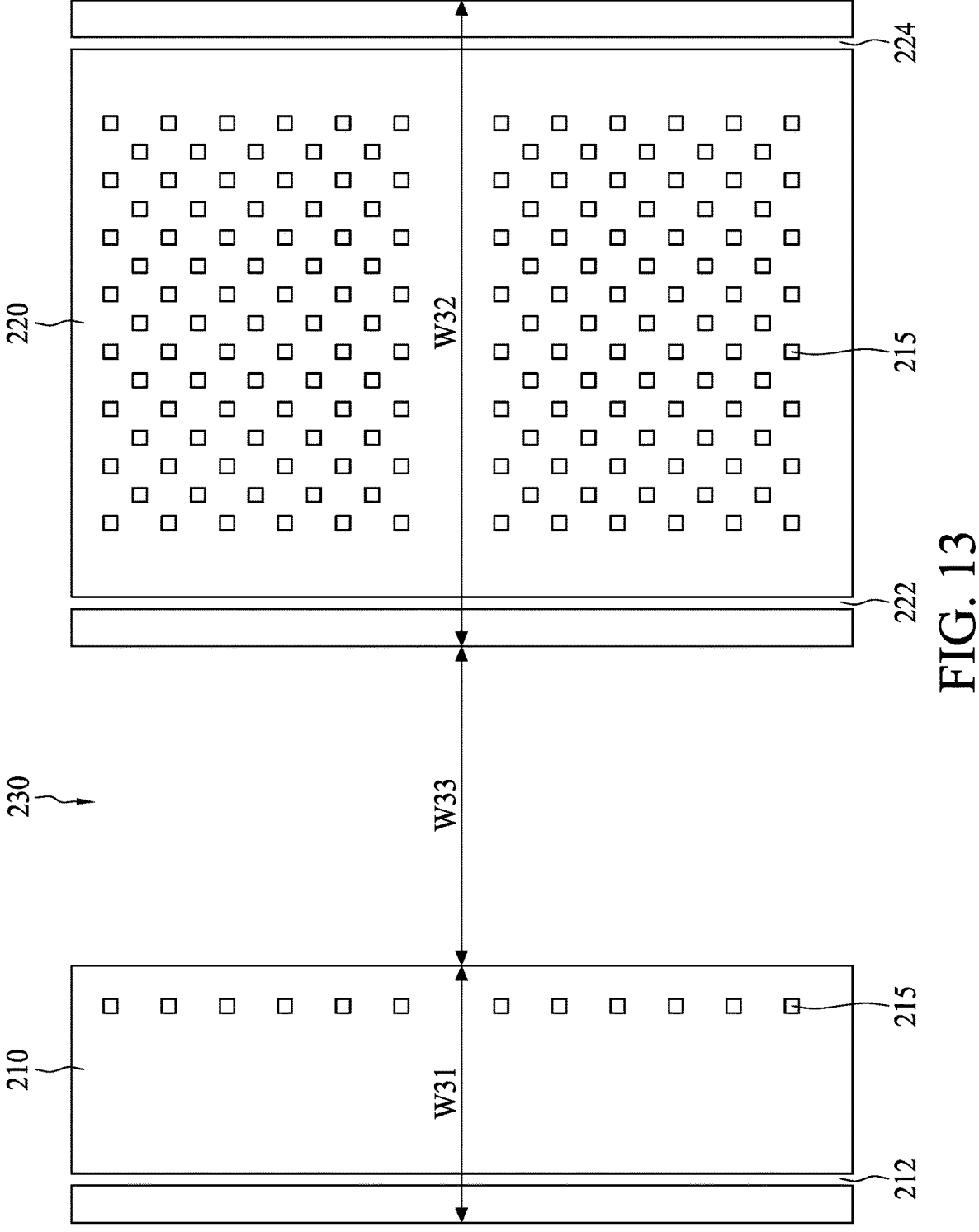
FIG. 13 illustrates a plan view of the seal ring structure in accordance with embodiments of the present disclosure.

FIG. 13 shows a plan view of wiring patterns corresponding to the inner seal ring structures 70, 75 and the field barrier structures 90, 92, 94 and 96 shown in FIGS. 5A, 5B and 6-12B above, according to some embodiments of the present disclosure.

As set forth above, the inner seal ring structures and the field barrier structures include a stack of wiring layers (wiring patterns) and vias connecting vertically adjacent wiring layers. In some embodiments, the wiring pattern of each of the inner seal ring structures 70, 75 and the field barrier structures 90, 92, 94 and 96 includes a first line pattern 210 (frame or ring shape) and a second line pattern 220 (frame or ring shape) spaced apart from each other by a gap 230 as shown in FIG. 13.

In some embodiments, a plurality of vias 215 are provided to the first line pattern 210 and the second line pattern 220, respectively. The plurality of vias are filled with a conductive material and connected to the lower wiring pattern. In some embodiments, the plurality of vias are arranged in a matrix, for example a staggered matrix.

In some embodiments, one or more slits 212, 222 and 224 are optionally provided to the first line pattern 210 and the second line pattern 220. In some embodiments, the slits are filled with a conductive material and connected to the lower wiring pattern.

In some embodiments, the width W31 of the first line pattern is in a range from about 0.5 μm to about 5 μm. In some embodiments, the width W32 of the second line pattern is greater than the width W31 and is in a range from about 2 μm to about 15 μm. In some embodiments, the space W33 between the first and second line patterns is in a range from about 2 μm to about 20 μm. In some embodiments, a size of the vias is in a range from about 100 nm to about 500 nm. In some embodiments, a width of the slit is in a range from about 100 nm to about 500 nm. In some embodiments, one or more of the widths/spaces W31, W32 or W33 are different between the first and second inner seal ring structures, between the inner seal ring structures and the field barrier structures and/or between the field barrier structures.

Figure 14:
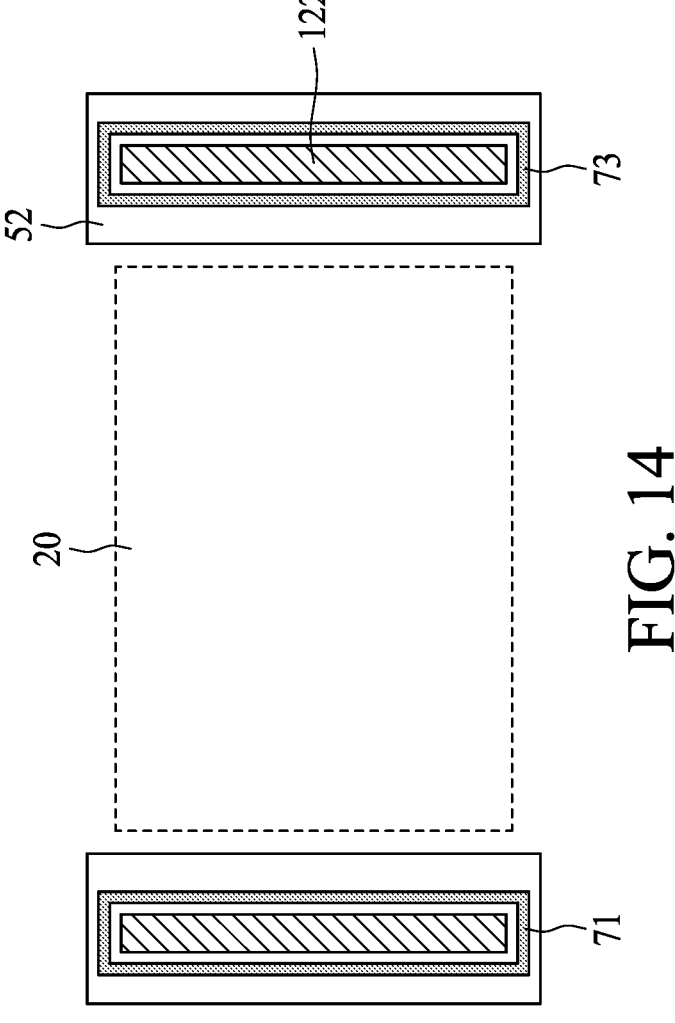
FIG. 14 illustrates a plan view of a CMOS image sensor in accordance with embodiments of the present disclosure.

In some embodiments, as shown in FIG. 14, the inner seal ring structures and/or the field barrier structures 71, 73 are provided surrounding photo diodes 122 under the light shielding structure 52.

In the present embodiments, the additional isolation structures and/or field barrier structures together with the seal ring structures provide an additional optical isolation for the black level calibration area.

According to embodiments of the present disclosure, a complementary metal-oxide-semiconductor (CMOS) image sensor includes a substrate having a first principal surface and a second principal surface opposite to the first principal surface, an image pixel area including a plurality of photo diodes disposed in the substrate and a plurality of color filters disposed over the first principal surface of the substrate, and a black level calibration area adjacent to the image pixel area for determining a dark voltage current. The black level calibration area includes a dark current sensing circuit including one or more photo diodes disposed in the substrate, a first seal ring structure disposed over the second principal surface and surrounding the image pixel area in plan view, a second seal ring structure disposed over the second principal surface and surrounding the image pixel area in plan view such that the dark current sensing circuit is disposed between the first seal ring structure and the second seal ring structure, an opaque cover layer disposed over the first principal surface and covering the dark current sensing circuit, the first seal ring structure and the second seal ring structure, and one or more first trench isolation structures extending from the first principal surface to an inside the substrate and disposed between the first seal ring structure and the opaque cover layer. In one or more of the foregoing and following embodiments, the black level calibration area further includes one or more second trench isolation structures extending from the second principal surface to the inside the substrate and disposed between the first seal ring structure and the opaque cover layer. In one or more of the foregoing and following embodiments, a depth of the one or more first trench isolation structures is greater than a depth of the one or more second trench isolation structures. In one or more of the foregoing and following embodiments, the black level calibration area further comprises one or more third trench isolation structures extending from the first principal surface to the inside the substrate and disposed between the second seal ring structure and the opaque cover layer. In one or more of the foregoing and following embodiments, the black level calibration area further comprises one or more fourth trench isolation structures extending from the second principal surface to the inside the substrate and disposed between the second seal ring structure and the opaque cover layer. In one or more of the foregoing and following embodiments, a depth of the one or more third trench isolation structures is greater than a depth of the one or more fourth trench isolation structures. In one or more of the foregoing and following embodiments, the black level calibration area further comprises one or more fifth trench isolation structures extending from the first principal surface to the inside the substrate and disposed between the dark current sensing circuit and the opaque cover layer. In one or more of the foregoing and following embodiments, a thickness of a first portion of the opaque cover layer overlapping the first seal ring structure and a thickness of a second portion of the opaque cover layer overlapping the second seal ring structure in plan view are smaller than a thickness of a third portion of the opaque cover layer overlapping the dark current sensing circuit.

According to another embodiment of the present disclosure, a CMOS image sensor includes a first semiconductor circuit, including: a first substrate having a first principal surface and a second principal surface opposite to the first principal surface; an image pixel area including a plurality of photo diodes disposed in the substrate and a plurality of color filters disposed over the first principal surface of the substrate; a black level calibration area adjacent to the image pixel area for determining a dark voltage current; and a first wiring structure coupled to the plurality of photo diodes, and a second semiconductor circuit, including: a second substrate having a first principal surface and a second principal surface opposite to the first principal surface; a plurality of transistors disposed over the first principal surface of the second substrate; and a second wiring structure coupled to the plurality of transistors. The first semiconductor circuit is attached to the second semiconductor circuit such that the second principal surface of the first substrate faces the first principal surface of the second substrate and the first wiring structure is coupled to the second wiring structure. The black level calibration area includes a dark current sensing circuit including one or more photo diodes disposed in the substrate, a first seal ring structure disposed over the second principal surface and surrounding the image pixel area in plan view, a second seal ring structure disposed over the second principal surface and surrounding the image pixel area in plan view such that the dark current sensing circuit is disposed between the first seal ring structure and the second seal ring structure, and an opaque cover layer disposed over the first principal surface and covering the dark current sensing circuit, the first seal ring structure and the second seal ring structure. In one or more of the foregoing and following embodiments, the black level calibration area includes first trench isolation structures extending from the first principal surface of the first substrate to an inside the first substrate and disposed between the opaque cover layer and the first and second seal ring structures. In one or more of the foregoing and following embodiments, the black level calibration area includes second trench isolation structures extending from the first principal surface of the first substrate to an inside the first substrate and disposed between the opaque cover layer and the dark current sensing circuit. In one or more of the foregoing and following embodiments, the second semiconductor circuit includes a third seal ring structure disposed over the second substrate and coupled to the first seal ring structure, and a fourth seal ring structure disposed over the second substrate and coupled to the second seal ring structure. In one or more of the foregoing and following embodiments, the opaque cover layer is made of tungsten or an alloy of tungsten. In one or more of the foregoing and following embodiments, the opaque cover layer includes a first layer made of tungsten or an alloy of tungsten and a second layer disposed over the first layer and made of a dielectric material.

In accordance with another aspect of the present disclosure, a CMOS image sensor includes a substrate having a first principal surface and a second principal surface opposite to the first principal surface, an image pixel area including a plurality of photo diodes disposed in the substrate and a plurality of color filters disposed over the first principal surface of the substrate, and a black level calibration area adjacent to the image pixel area for determining a dark voltage current. The black level calibration area includes a dark current sensing circuit including one or more photo diodes disposed in the substrate, a first seal ring structure disposed over the second principal surface and surrounding the image pixel area in plan view, a second seal ring structure disposed over the second principal surface and surrounding the image pixel area in plan view, a first barrier structure disposed over the second principal surface, a second barrier structure disposed over the second principal surface, an opaque cover layer disposed over the first principal surface and covering the dark current sensing circuit, the first seal ring structure, the second seal ring structure, the first barrier structure and the second barrier structure, and first trench isolation structures extending from the first principal surface to an inside the substrate and disposed between the opaque cover layer and the first and second seal ring structures. The dark current sensing circuit is disposed between the first seal ring structure and the second seal ring structure and between the first barrier structure and the second barrier structure in plan view. In one or more of the foregoing and following embodiments, the black level calibration area includes second trench isolation structures extending from the second principal surface to the inside the substrate and disposed between the opaque cover layer and the first and second seal ring structures. In one or more of the foregoing and following embodiments, the black level calibration area includes third trench isolation structures extending from the first principal surface to the inside the substrate and disposed between the opaque cover layer and the first and second barrier structures. In one or more of the foregoing and following embodiments, the black level calibration area includes fourth trench isolation structures extending from the first principal surface to the inside the substrate and disposed between the opaque cover layer and the first and second barrier structures. In one or more of the foregoing and following embodiments, each of the first seal ring structure, the second seal ring structure, the first barrier structure and the second barrier structure includes conductive wiring patterns and one or more vias coupling adjacent wiring patterns. In one or more of the foregoing and following embodiments, a width in plan view of each of the first seal ring structure, the second seal ring structure, the first barrier structure and the second barrier structure is in a range from 10 μm to 40 μm.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A complementary metal-oxide-semiconductor (CMOS) image sensor, comprising:
    a substrate having a first principal surface and a second principal surface opposite to the first principal surface;
    an image pixel area including a plurality of photo diodes disposed in the substrate and a plurality of color filters disposed over the first principal surface of the substrate; and
    a black level calibration area adjacent to the image pixel area for determining a dark voltage current,
    wherein the black level calibration area comprises:
        a dark current sensing circuit including one or more photo diodes disposed in the substrate;
        a first seal ring structure disposed over the second principal surface and surrounding the image pixel area in plan view;
        a second seal ring structure disposed over the second principal surface and surrounding the image pixel area in plan view such that the dark current sensing circuit is disposed between the first seal ring structure and the second seal ring structure;
        an opaque cover layer disposed over the first principal surface and covering the dark current sensing circuit, the first seal ring structure and the second seal ring structure; and
        one or more first trench isolation structures extending from the first principal surface to an inside of the substrate and disposed between the first seal ring structure and the opaque cover layer in plan view.

2. The CMOS image sensor of claim 1, wherein the black level calibration area further comprises one or more second trench isolation structures extending from the second principal surface to the inside the substrate and disposed between the first seal ring structure and the opaque cover layer.

3. The CMOS image sensor of claim 2, wherein a depth of the one or more first trench isolation structures is greater than a depth of the one or more second trench isolation structures.

4. The CMOS image sensor of claim 3, wherein the black level calibration area further comprises one or more third trench isolation structures extending from the first principal surface to the inside the substrate and disposed between the second seal ring structure and the opaque cover layer.

5. The CMOS image sensor of claim 4, wherein the black level calibration area further comprises one or more fourth trench isolation structures extending from the second principal surface to the inside the substrate and disposed between the second seal ring structure and the opaque cover layer.

6. The CMOS image sensor of claim 5, wherein a depth of the one or more third trench isolation structures is greater than a depth of the one or more fourth trench isolation structures.

7. The CMOS image sensor of claim 4, wherein the black level calibration area further comprises one or more fifth trench isolation structures extending from the first principal surface to the inside the substrate and disposed between the dark current sensing circuit and the opaque cover layer.

8. The CMOS image sensor of claim 1, wherein a thickness of a first portion of the opaque cover layer overlapping the first seal ring structure and a thickness of a second portion of the opaque cover layer overlapping the second seal ring structure in plan view are smaller than a thickness of a third portion of the opaque cover layer overlapping the dark current sensing circuit.

9. A complementary metal-oxide-semiconductor (CMOS) image sensor, comprising:
    a first semiconductor circuit, including:
        a first substrate having a first principal surface and a second principal surface opposite to the first principal surface;
        an image pixel area including a plurality of photo diodes disposed in the first substrate and a plurality of color filters disposed over the first principal surface of the first substrate;
        a black level calibration area adjacent to the image pixel area for determining a dark voltage current; and
        a first wiring structure coupled to the plurality of photo diodes; and
    a second semiconductor circuit, including:
        a second substrate having a first principal surface and a second principal surface opposite to the first principal surface;
        a plurality of transistors disposed over the first principal surface of the second substrate; and
        a second wiring structure coupled to the plurality of transistors, wherein:
    the first semiconductor circuit is attached to the second semiconductor circuit such that the second principal surface of the first substrate faces the first principal surface of the second substrate and the first wiring structure is coupled to the second wiring structure, and
    the black level calibration area comprises:
        a dark current sensing circuit including one or more photo diodes disposed in the first substrate;
        a first seal ring structure disposed over the second principal surface and surrounding the image pixel area in plan view;
        a second seal ring structure disposed over the second principal surface and surrounding the image pixel area in plan view such that the dark current sensing circuit is disposed between the first seal ring structure and the second seal ring structure; and
        an opaque cover layer disposed over the first principal surface and covering the dark current sensing circuit, the first seal ring structure and the second seal ring structure.

10. The CMOS image sensor of claim 9, wherein the black level calibration area comprises:
    first trench isolation structures extending from the first principal surface of the first substrate to an inside the first substrate and disposed between the opaque cover layer and the first and second seal ring structures.

11. The CMOS image sensor of claim 10, wherein the black level calibration area comprises:

second trench isolation structures extending from the first principal surface of the first substrate to an inside the first substrate and disposed between the opaque cover layer and the dark current sensing circuit.

12. The CMOS image sensor of claim 9, wherein the second semiconductor circuit includes:

a third seal ring structure disposed over the second substrate and coupled to the first seal ring structure; and a fourth seal ring structure disposed over the second substrate and coupled to the second seal ring structure.

13. The CMOS image sensor of claim 9, wherein the opaque cover layer is made of tungsten or an alloy of tungsten.

14. The CMOS image sensor of claim 9, wherein the opaque cover layer includes a first layer made of tungsten or an alloy of tungsten and a second layer disposed over the first layer and made of a dielectric material.

15. A complementary metal-oxide-semiconductor (CMOS) image sensor, comprising:

a substrate having a first principal surface and a second principal surface opposite to the first principal surface;

an image pixel area including a plurality of photo diodes disposed in the substrate and a plurality of color filters disposed over the first principal surface of the substrate; and a black level calibration area adjacent to the image pixel area for determining a dark voltage current, wherein:

the black level calibration area comprises:

a dark current sensing circuit including one or more photo diodes disposed in the substrate;

a first seal ring structure disposed over the second principal surface and surrounding the image pixel area in plan view;

a second seal ring structure disposed over the second principal surface and surrounding the image pixel area in plan view;

a first barrier structure disposed over the second principal surface;

a second barrier structure disposed over the second principal surface;

an opaque cover layer disposed over the first principal surface and covering the dark current sensing circuit, the first seal ring structure, the second seal ring structure, the first barrier structure and the second barrier structure; and first trench isolation structures extending from the first principal surface to an inside the substrate and disposed between the opaque cover layer and the first and second seal ring structures, and the dark current sensing circuit is disposed between the first seal ring structure and the second seal ring structure and between the first barrier structure and the second barrier structure in plan view.

16. The CMOS image sensor of claim 15, wherein the black level calibration area comprises:

second trench isolation structures extending from the second principal surface to the inside the substrate and disposed between the opaque cover layer and the first and second seal ring structures.

17. The CMOS image sensor of claim 16, wherein the black level calibration area comprises:

third trench isolation structures extending from the first principal surface to the inside the substrate and disposed between the opaque cover layer and the first and second barrier structures.

18. The CMOS image sensor of claim 17, wherein the black level calibration area comprises:

fourth trench isolation structures extending from the first principal surface to the inside the substrate and disposed between the opaque cover layer and the first and second barrier structures.

19. The CMOS image sensor of claim 15, wherein each of the first seal ring structure, the second seal ring structure, the first barrier structure and the second barrier structure includes conductive wiring patterns and one or more vias coupling adjacent wiring patterns.

20. The CMOS image sensor of claim 15, wherein a width in plan view of each of the first seal ring structure, the second seal ring structure, the first barrier structure and the second barrier structure is in a range from 10 μm to 40 μm.

* * * * *